United States Patent
Duan et al.

(10) Patent No.: US 10,419,246 B2
(45) Date of Patent: Sep. 17, 2019

(54) C-PHY TRAINING PATTERN FOR ADAPTIVE EQUALIZATION, ADAPTIVE EDGE TRACKING AND DELAY CALIBRATION

(71) Applicant: QUALCOMM Incorporated, San Diego, CA (US)

(72) Inventors: Ying Duan, San Diego, CA (US); Abhay Dixit, San Diego, CA (US); Shih-Wei Chou, San Diego, CA (US); Jing Wu, San Diego, CA (US); Harry Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/680,959

(22) Filed: Aug. 18, 2017

(65) Prior Publication Data

US 2018/0062883 A1    Mar. 1, 2018

Related U.S. Application Data

(60) Provisional application No. 62/381,775, filed on Aug. 31, 2016.

(51) Int. Cl.
*H04L 25/02* (2006.01)
*G01R 31/317* (2006.01)
(Continued)

(52) U.S. Cl.
CPC .... *H04L 25/0272* (2013.01); *G01R 31/31709* (2013.01); *H03K 5/135* (2013.01);
(Continued)

(58) Field of Classification Search
CPC .. H04B 3/46; H04B 3/462; H04B 3/54; G06F 13/4295; H04L 25/14; H04L 25/0272;
(Continued)

(56) References Cited

U.S. PATENT DOCUMENTS 5,325,048 A * 6/1994 Longini ............... G01R 35/04
                                                            324/130
6,377,640 B2 * 4/2002 Trans ..................... H04B 1/00
                                                            370/286

(Continued)

FOREIGN PATENT DOCUMENTS

EP         2814198 A2   12/2014
JP       2017112427 A    6/2017
(Continued)

OTHER PUBLICATIONS

International Search Report and Written Opinion—PCT/US2017/047828—ISA/EPO—dated Oct. 6, 2017.
(Continued)

*Primary Examiner* — Akelaw Teshale
(74) *Attorney, Agent, or Firm* — Loza & Loza LLP

(57) ABSTRACT

Methods, apparatus, and systems for data communication over a multi-wire, multi-phase interface are disclosed. A method of calibration includes configuring a 3-phase signal to include a high frequency component and a low frequency component during a calibration period, and transmitting a version of the 3-phase signal on each wire of a 3-wire interface. The version of the 3-phase signal transmitted on each wire is out-of-phase with the versions of the 3-phase signal transmitted on each of the other wires of the 3-wire interface. The 3-phase signal may be configured to enable a receiver to determine certain operating parameters of the 3-wire interface.

30 Claims, 24 Drawing Sheets

(51) Int. Cl.

| | | |
|---|---|---|
| *H03K 5/135* | (2006.01) | |
| *H04B 3/462* | (2015.01) | |
| *H04L 7/00* | (2006.01) | |
| *H04L 25/14* | (2006.01) | |
| *H04L 25/49* | (2006.01) | |
| *H04L 23/00* | (2006.01) | |
| *H04B 3/54* | (2006.01) | |
| *H04L 1/20* | (2006.01) | |
| *H04L 7/04* | (2006.01) | |
| *H04L 25/03* | (2006.01) | |
| *G06F 13/42* | (2006.01) | |

(52) U.S. Cl.
CPC ............ *H04B 3/462* (2013.01); *H04L 7/002* (2013.01); *H04L 7/0008* (2013.01); *H04L 23/00* (2013.01); *H04L 25/0286* (2013.01); *H04L 25/14* (2013.01); *H04L 25/4917* (2013.01); *G06F 13/4295* (2013.01); *H04B 3/54* (2013.01); *H04L 1/205* (2013.01); *H04L 7/04* (2013.01); *H04L 25/49* (2013.01); *H04L 2025/03356* (2013.01); *H04L 2025/03598* (2013.01)

(58) Field of Classification Search
CPC ..... H04L 25/08; H04L 25/49; H04L 25/4917; H04L 7/002; H04L 25/0286; H04L 7/0008; H04L 1/205; H04L 2025/03598; H04L 2025/03356; H04L 7/04; H04L 23/00; H03K 5/135; G01R 31/31709
See application file for complete search history.

(56) References Cited

U.S. PATENT DOCUMENTS

| | | | |
|---|---|---|---|
| 7,149,265 B2 | 12/2006 | Wang et al. | |
| 7,916,780 B2 | 3/2011 | Lee | |
| 8,433,022 B2 | 4/2013 | Onodera | |
| 9,246,666 B2 | 1/2016 | Kil | |
| 9,319,218 B2* | 4/2016 | Pandey | H04B 3/00 |
| 9,473,291 B2 | 10/2016 | Kil et al. | |
| 9,485,080 B1* | 11/2016 | Duan | H04L 7/0008 |
| 9,496,879 B1* | 11/2016 | Duan | H04L 7/033 |
| 9,525,543 B2 | 12/2016 | Liu et al. | |
| 9,537,617 B2 | 1/2017 | Chandrasekaran et al. | |
| 9,553,635 B1* | 1/2017 | Sejpal | H04B 3/54 |
| 9,735,950 B1 | 8/2017 | Liu et al. | |
| 9,866,413 B2 | 1/2018 | Chang | |
| 10,298,381 B1 | 5/2019 | Lee et al. | |
| 10,333,690 B1 | 6/2019 | Duan et al. | |
| 2003/0043926 A1 | 3/2003 | Terashima et al. | |
| 2003/0141910 A1 | 7/2003 | Reindl | |
| 2009/0168849 A1* | 7/2009 | Rouxel | H04B 1/707 375/140 |
| 2010/0027706 A1* | 2/2010 | Tanimoto | H04L 25/0272 375/279 |
| 2011/0304340 A1 | 12/2011 | Hall et al. | |
| 2014/0313986 A1* | 10/2014 | Jeffery | H04W 74/0816 370/329 |
| 2014/0348214 A1 | 11/2014 | Sengoku et al. | |
| 2015/0030112 A1* | 1/2015 | Wiley | H04L 25/0292 375/360 |
| 2017/0032757 A1 | 2/2017 | Itoigawa et al. | |
| 2017/0264379 A1 | 9/2017 | Wiley | |
| 2018/0019863 A1 | 1/2018 | Liao et al. | |
| 2018/0131503 A1* | 5/2018 | Duan | H04L 7/0012 |
| 2018/0152282 A1 | 5/2018 | Choi et al. | |
| 2018/0323953 A1 | 11/2018 | Chiueh et al. | |

FOREIGN PATENT DOCUMENTS

| | | |
|---|---|---|
| WO | WO-2016007218 A1 | 1/2016 |
| WO | 2017145585 A1 | 8/2017 |

OTHER PUBLICATIONS

MT41J512M4., et al., "DDR3 SORAW," Mar. 3, 2016 (Mar. 3, 2016), XP055410563, URL:https://www.micron.com/-/media/documents/products/data-sheet/dram/ddr3/2gb_ddr3 sdram.pdf, pp. 1-215.

* cited by examiner

C-PHY TRAINING PATTERN FOR ADAPTIVE EQUALIZATION, ADAPTIVE EDGE TRACKING AND DELAY CALIBRATION

CROSS-REFERENCE TO RELATED APPLICATIONS

This application claims priority to and the benefit of Provisional Patent Application No. 62/381,775 filed in the U.S. Patent Office on Aug. 31, 2016, and the entire content of is incorporated herein by reference herein in its entirety and for all applicable purposes

TECHNICAL FIELD

The present disclosure relates generally to high-speed data communications interfaces, and more particularly, to clock generation in a receiver coupled to a multi-wire, multi-phase data communication link.

BACKGROUND

Manufacturers of mobile devices, such as cellular phones, may obtain components of the mobile devices from various sources, including different manufacturers. For example, an application processor in a cellular phone may be obtained from a first manufacturer, while an imaging device or camera may be obtained from a second manufacturer, and a display may be obtained from a third manufacturer. The application processor, the imaging device, the display controller, or other types of device may be interconnected using a standards-based or proprietary physical interface. In one example, an imaging device may be connected using the Camera Serial Interface (CSI) defined by the Mobile Industry Processor Interface (MIPI) Alliance. In another example, a display may include an interface that conforms to the Display Serial Interface (DSI) standard specified by the Mobile Industry Processor Interface (MIPI) Alliance.

The C-PHY interface, which is a multiphase three-wire interface defined by the MIPI Alliance, uses a trio of conductors to transmit information between devices. Each of the three wires may be in one of three signaling states during transmission of a symbol over the C-PHY interface. Clock information is encoded in a sequence of symbols transmitted on the C-PHY interface and a receiver generates a clock signal from transitions between consecutive symbols. The maximum speed of the C-PHY interface and the ability of a clock and data recovery (CDR) circuit to recover clock information may be limited by the maximum time variation related to transitions of signals transmitted on the different wires of the communication link. A receiver may employ delay circuits to ensure that all of the conductors in the trio have assumed a stable signaling state before providing a sampling edge. The transmission rate of the link may be limited by the delay values used, and there is an ongoing need for optimizing and calibrating clock generation circuits that can function reliably as signaling frequencies of multi-wire interfaces increase.

SUMMARY

Embodiments disclosed herein provide systems, methods and apparatus that enable improved communications on a multi-wire and/or multiphase communications link. The communications link may be deployed in apparatus such as a mobile terminal having multiple Integrated Circuit (IC) devices.

In various aspects of the disclosure, a method of calibration includes configuring a 3-phase signal to include a high frequency component and a low frequency component during a calibration period, and transmitting a version of the 3-phase signal on each wire of a 3-wire interface. The version of the 3-phase signal transmitted on each wire is out-of-phase with the versions of the 3-phase signal transmitted on each of the other wires of the 3-wire interface. The 3-phase signal may be configured to enable a receiver to determine certain operating parameters of the 3-wire interface.

In some aspects, configuring the 3-phase signal includes transmitting a first sequence of symbols selected to cause a differential receiver to produce a constant output during a first portion of the calibration period. The differential receiver may be coupled to two wires of the 3-wire interface. Configuring the 3-phase signal may include transmitting a second sequence of symbols selected to cause the differential receiver to produce an output that changes for every symbol transmitted during a second portion of the calibration period. Configuring the 3-phase signal may include transmitting two sequences of symbols that cause a differential receiver to produce output signals that are the inverse of one another. Each of the two sequences of symbols alternate in transmission during the calibration period. Each of the two sequences of symbols may include 16 symbols. The two sequences of symbols may be repeatedly and alternately transmitted during the calibration period.

The calibration period may occur when the 3-wire interface is initialized. The calibration period may occur between transmissions of frames on the 3-wire interface.

In one aspect, the method includes monitoring the 3-wire interface while transmitting a version of the 3-phase signal on each wire of the 3-wire interface, and calibrating one or more timing circuit based on characteristics of the 3-wire interface that are determined by monitoring the 3-wire interface.

In various aspects of the disclosure, a processor-readable medium includes code, instructions and/or data. The medium may be transitory or non-transitory. The instructions, when executed by one or more processors processor may cause the one or more processors to configure a 3-phase signal to include a high frequency component and a low frequency component during a calibration period, and transmit a version of the 3-phase signal on each wire of a 3-wire interface. The version of the 3-phase signal transmitted on each wire is out-of-phase with the versions of the 3-phase signal transmitted on each of the other wires of the 3-wire interface. The 3-phase signal may be configured to enable a receiver to determine certain operating parameters of the 3-wire interface.

In various aspects of the disclosure, an apparatus includes means for configuring a 3-phase signal to include a high frequency component and a low frequency component during a calibration period, and means for transmitting a version of the 3-phase signal on each wire of a 3-wire interface. The version of the 3-phase signal transmitted on each wire may be out-of-phase with versions of the 3-phase signal transmitted on each other wire of the 3-wire interface. The 3-phase signal may be configured to enable a receiver to determine certain operating parameters of the 3-wire interface.

In one aspect, the means for configuring the 3-phase signal is adapted to transmit a first sequence of symbols selected to cause a differential receiver to produce a constant output during a first portion of the calibration period, transmit a second sequence of symbols selected to cause the differential receiver to produce an output that changes for every symbol transmitted during a second portion of the calibration period. The differential receiver is coupled to two wires of the 3-wire interface.

In one aspect, the means for configuring the 3-phase signal is adapted to transmit two sequences of symbols that cause a differential receiver to produce output signals that are the inverse of one another. Each of the two sequences of symbols alternate in transmission during the calibration period. Each of the two sequences of symbols includes 16 symbols. The two sequences of symbols may be repeatedly and/or alternately transmitted during the calibration period.

In some aspects, the apparatus includes means for monitoring the 3-wire interface while transmitting a version of phase signal on each wire of the 3-wire interface, and means for calibrating one or more timing circuit based on characteristics of the 3-wire interface that are determined by monitoring the 3-wire interface.

In various aspects of the disclosure, a method of calibration includes receiving a 3-phase signal from the wires of a 3-wire interface, generating a receive clock signal from transitions in signaling state of the 3-wire interface, and calibrating at least one delay element used to generate the receive clock signal based on characteristics of the 3-wire interface that are determined while a training pattern in the 3-phase signal is being received. The training pattern in the 3-phase signal may include a high frequency component and a low frequency component. Each wire of the 3-wire interface may carry a version of the 3-phase signal that is out-of-phase with versions of the 3-phase signal carried on other wires of the 3-wire interface.

In certain aspects, receiving the 3-phase signal includes decoding a set of symbols from the 3-phase signal. A first sequence of symbols in the set of symbols may be configured to produce a constant output at a differential receiver of the receiving device during a first portion of a calibration period. The differential receiver is coupled to two wires of the 3-wire interface. A second sequence of symbols in the set of symbols may be configured to cause the differential receiver to produce an output that changes for every symbol transmitted during a second portion of the calibration period. The set of symbols may be configured to produce a two-part training pattern in a signal provided by the differential receiver. A first part of the two-part training pattern and a second part of the two-part training pattern may be inverses of one another. In one example, the set of symbols includes 32 symbols when decoded correctly. The set of symbols may be repeatedly received during the calibration period.

In some aspects, the method includes determining whether the set of symbols corresponds to a set of training symbols known to the receiving device and, when the set of symbols is different from the set of training symbols, adjusting the at least one delay element until the set of symbols corresponds to a set of training symbols.

According to some aspects, the training pattern is received while the 3-wire interface is being initialized. The training pattern may be received between transmissions of frames on the 3-wire interface.

In some aspects, the method includes determining an operating characteristic of the 3-wire interface while the training pattern is being received, and calibrating the at least one delay element based on the operating characteristic of the 3-wire interface. The operating characteristic of the 3-wire interface may include a minimum unit interval time. The operating characteristic of the 3-wire interface may include a measurement of maximum encoding jitter. The operating characteristic of the 3-wire interface may include a measurement of worst case inter-symbol interference.

In various aspects of the disclosure, an apparatus includes means for receiving a 3-phase signal from a 3-wire interface, means for generating clock signals, configured to generate a receive clock signal from transitions in signaling state of the 3-wire interface, wherein the means for generating clock signals comprises at least one delay element, and means for calibrating the least one delay element. The means for calibrating may be configured to operate based on characteristics of the 3-wire interface that are determined while a training pattern in the 3-phase signal is being received. Each wire of the 3-wire interface may carry a version of the 3-phase signal that is out-of-phase with versions of the 3-phase signal carried on other wires of the 3-wire interface. The training pattern in the 3-phase signal may include a high frequency component and a low frequency component.

In certain aspects, the means for receiving the 3-phase signal is configured to decode a set of symbols from the 3-phase signal. A first sequence of symbols in the set of symbols may be configured to produce a constant output at a differential receiver during a first portion of a calibration period, the differential receiver being coupled to two wires of the 3-wire interface. A second sequence of symbols in the set of symbols may be configured to cause the differential receiver to produce an output that changes for every symbol transmitted during a second portion of the calibration period. The set of symbols may be configured to produce a two-part training pattern in a signal provided by the differential receiver. A first part of the two-part training pattern and a second part of the two-part training pattern may be inverses of one another.

In one aspect, the apparatus includes means for determining whether the set of symbols corresponds to a set of training symbols known to the apparatus, and means for adjusting delay elements configured to adjust at least one delay element until the set of symbols corresponds to a set of training symbols. The training pattern may be received while the 3-wire interface is being initialized or between transmissions of frames on the 3-wire interface.

In one aspect, the means for calibrating the least one delay element is configured to determine an operating characteristic of the 3-wire interface while the training pattern is being received, and calibrate the at least one delay element based on the operating characteristic of the 3-wire interface. The operating characteristic of the 3-wire interface may include a minimum unit interval time, a measurement of maximum encoding jitter, or a measurement of worst case inter-symbol interference.

In various aspects of the disclosure, a processor-readable medium includes code, instructions and/or data. The medium may be transitory or non-transitory. The instructions, when executed by one or more processors processor may cause the one or more processors to receive a 3-phase signal from the wires of a 3-wire interface, generate a receive clock signal from transitions in signaling state of the 3-wire interface, and calibrate at least one delay element used to generate the receive clock signal based on characteristics of the 3-wire interface that are determined while a training pattern in the 3-phase signal is being received. The training pattern in the 3-phase signal may include a high frequency component and a low frequency component. Each wire of the 3-wire interface may carry a version of the 3-phase signal that is out-of-phase with versions of the 3-phase signal carried on other wires of the 3-wire interface.

DETAILED DESCRIPTION

Figure 1:
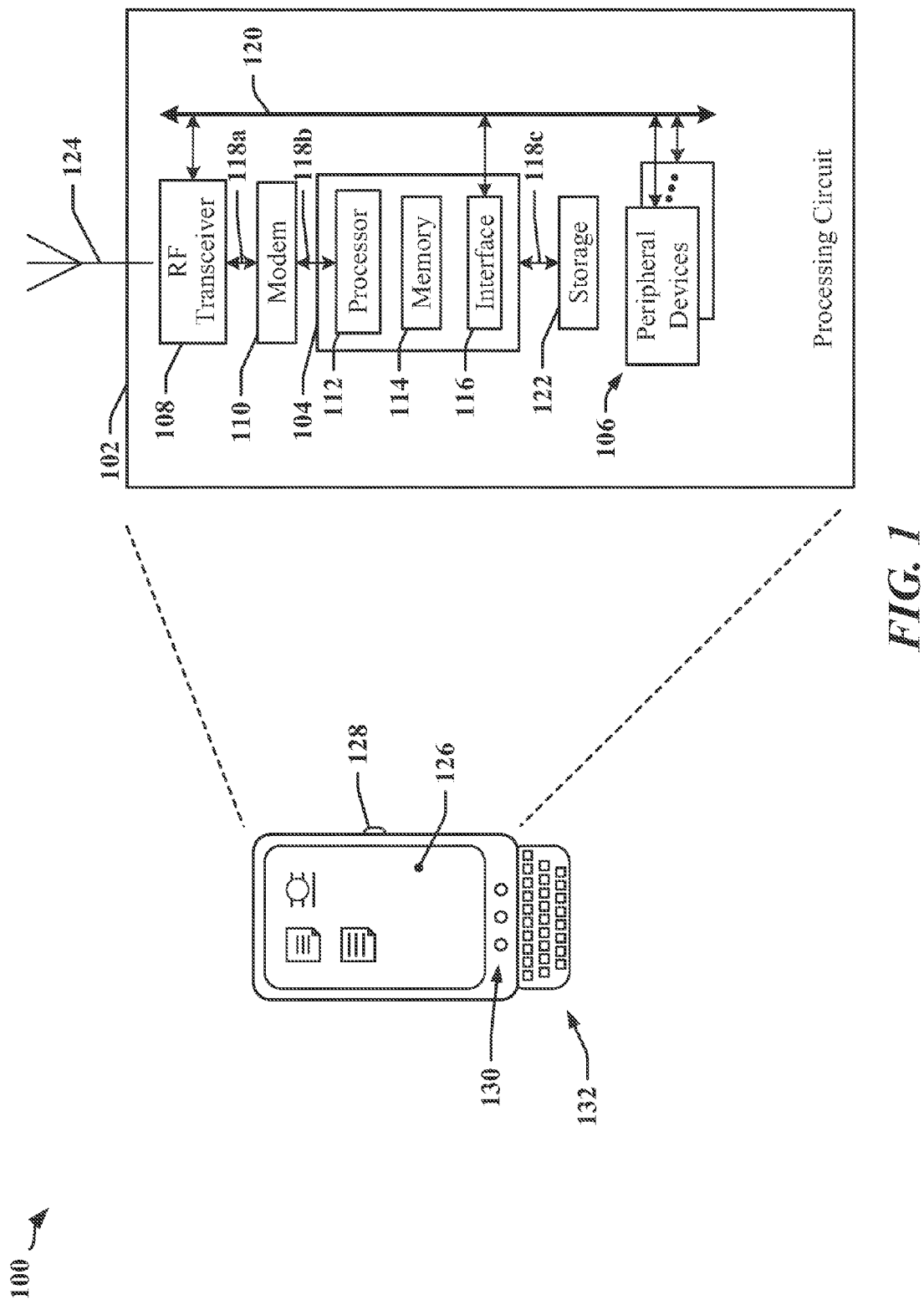
FIG. 1 depicts an apparatus employing a data link between IC devices that selectively operates according to one of plurality of available standards.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Overview

Certain aspects of the invention may be applicable to a C-PHY interface defined by the MIPI Alliance, which may be deployed to connect electronic devices that are subcomponents of a mobile apparatus such as a telephone, a mobile computing device, an appliance, automobile electronics, avionics systems, etc. Examples of a mobile apparatus include a mobile computing device, a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, avionics systems, a wearable computing device (e.g., a smart watch, a health or fitness tracker, eyewear, etc.), an appliance, a sensor, a security device, a vending machine, a smart meter, a drone, a multicopter, or any other similar functioning device.

The C-PHY interface is a high-speed serial interface that can provide high throughput over bandwidth-limited channels. The C-PHY interface may be deployed to connect application processors to peripherals, including displays and cameras. The C-PHY interface encodes data into symbols that are transmitted over a set of three wires, which may be referred to as a trio, or trio of wires. A three-phase signal is transmitted on each wire of the trio in different phases as defined by a current symbol interval. Each three-wire trio provides a lane on a communications link. A symbol interval may be defined as the interval of time in which a single symbol controls the signaling state of a trio. In each symbol interval, one wire is "undriven" while the remaining two of the three wires are differentially driven such that one of the two differentially driven wires assumes a first voltage level and the other differentially driven wire assumes to a second voltage level different from the first voltage level. The undriven wire may float, be driven, and/or be terminated such that it assumes a third voltage level that is at or near the mid-level voltage between the first and second voltage levels. In one example, the driven voltage levels may be +V and −V with the undriven voltage being 0 V. In another example, the driven voltage levels may be +V and 0 V with the undriven voltage being +V/2. Different symbols are transmitted in each consecutively transmitted pair of symbols, and different pairs of wires may be differentially driven in different symbol intervals.

Certain aspects disclosed herein provide a signal that includes a training pattern that supports multiphase clock data recovery in a C-PHY interface. The training pattern may enable various apparatus to determine minimum transmission times, maximum encoding jitter and worst case inter-symbol interference (ISI) for a C-PHY interface. The training pattern may be used for finding the minimum unit interval (UI) for symbol transmission, adaptive equalization parameters, and parameters for adaptive data edge tracking for clock data recovery. The training pattern may replace patterns derived from a pseudorandom binary sequence (PRBS). In some examples, the training pattern includes low frequency and high frequency components relevant to a C-PHY interface. The training pattern may be used to evaluate worst case ISI. In some examples, the training pattern includes double transition edges, and can be used to determine worst-case encoding jitter.

Example of Apparatus that may Employ a C-PHY Interface

According to certain aspects, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

FIG. 1 illustrates an example of an apparatus 100 that may employ a data communication bus. The apparatus 100 may include a processing circuit 102 having multiple circuits or devices 104, 106, 108 and/or 110, which may be implemented in one or more ASICs and/or one or more SoCs. In one example, the apparatus 100 may be a communication device and the processing circuit 102 may include ASIC 104 that includes a processor 112. The ASIC 104 may implement or function as a host or application processor. The apparatus 100 may include one or more peripheral devices 106, one or more modems 110 and a transceiver 108 that enables the apparatus to communicate through an antenna 124 with a radio access network, a core access network, the Internet and/or another network. The configuration and location of the circuits or devices 104, 106, 108, 110 may vary between applications.

The circuits or devices 104, 106, 108, 110 may include a combination of subcomponents. In one example, the ASIC 104 may include more than one processors 112, on-board memory 114, a bus interface circuit 116 and/or other logic circuits or functions. The processing circuit 102 may be controlled by an operating system that may provide an application programming interface (API) layer that enables the one or more processors 112 to execute software modules residing in the on-board memory 114 or other processor-readable storage 122 provided on the processing circuit 102. The software modules may include instructions and data stored in the on-board memory 114 or processor-readable storage 122. The ASIC 104 may access its on-board memory 114, the processor-readable storage 122, and/or storage external to the processing circuit 102. The on-board memory 114, the processor-readable storage 122 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 124, a display 126, operator controls, such as switches or buttons 128, 130 and/or an integrated or external keypad 132, among other components. A user interface module may be configured to operate with the display 126, keypad 132, etc. through a dedicated communication link or through one or more serial data interconnects.

The processing circuit 102 may provide one or more buses 118a, 118b, 118c, 120 that enable certain devices 104, 106, and/or 108 to communicate. In one example, the ASIC 104 may include a bus interface circuit 116 that includes a combination of circuits, counters, timers, control logic and other configurable circuits or modules. In one example, the bus interface circuit 116 may be configured to operate in accordance with communication specifications or protocols. The processing circuit 102 may include or control a power management function that configures and manages the operation of the apparatus 100.

Figure 2:
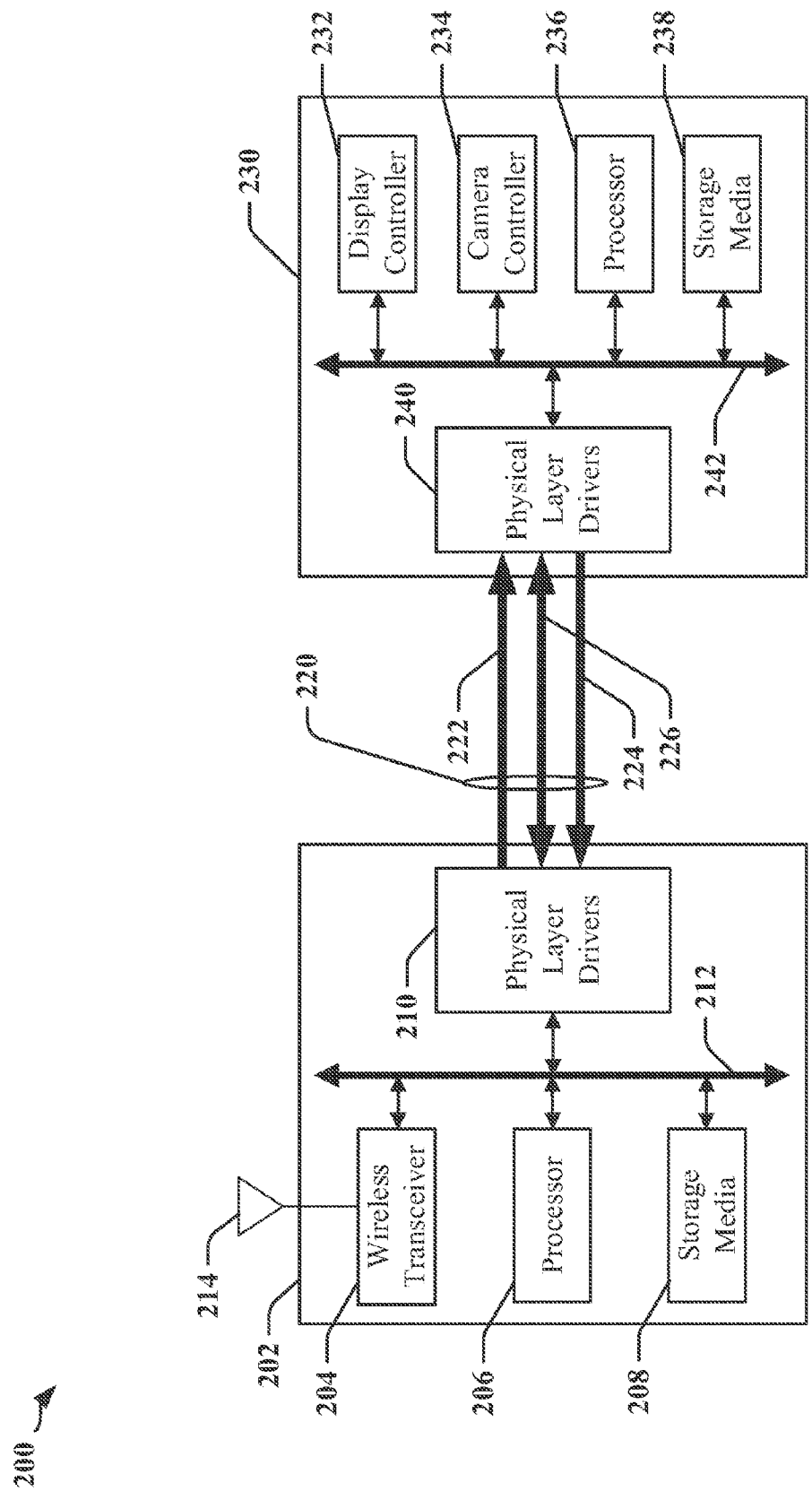
FIG. 2 illustrates a system architecture for an apparatus employing a data link between IC devices that selectively operates according to one of plurality of available standards.

FIG. 2 is a block schematic illustrating certain aspects of an apparatus 200 that includes a plurality of IC devices 202 and 230, which can exchange data and control information through a communication link 220. The communication link 220 may be used to connect a pair of IC devices 202 and 230 that are located in close proximity to one another, or that are physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, a portion of the communication link 220 may include a cable or optical connection.

The communication link 220 may include multiple channels 222, 224 and 226. One or more channel may be a bidirectional channel 226, and may operate in half-duplex and/or full-duplex modes. One or more channel 222 and 224 may be unidirectional. The communication link 220 may be asymmetrical, providing higher bandwidth in one direction.

In one example described herein, a first communication channel may be referred to as a forward channel 222 while a second communication channel may be referred to as a reverse channel 224. The first IC device 202 may be designated as a host system or transmitter, while the second IC device 230 may be designated as a client system or receiver, even if both IC devices 202 and 230 are configured to transmit and receive on the communication channel 222. In one example, the forward channel 222 may operate at a higher data rate when communicating data from a first IC device 202 to a second IC device 230, while the reverse channel 224 may operate at a lower data rate when communicating data from the second IC device 230 to the first IC device 202.

The IC devices 202 and 230 may each include a processor or other processing and/or computing circuit or device 206, 236. In one example, the first IC device 202 may perform core functions of the apparatus 200, including establishing and maintaining communication through an RF transceiver 204 and an antenna 214, while the second IC device 230 may support a user interface that manages or operates a display controller 232, and may control operations of a camera or video input device using a camera controller 234. Other features supported by one or more of the IC devices 202 and 230 may include a keyboard, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more internal bus 212 and 242 and/or a channel 222, 224 and/or 226 of the communication link 220.

The reverse channel 224 may be operated in the same manner as the forward channel 222, and the forward channel 222, and the reverse channel 224 may be capable of transmitting at comparable speeds or at different speeds, where speed may be expressed as data transfer rate and/or clocking rates. The forward and reverse data rates may be substantially the same or differ by orders of magnitude, depending on the application. In some applications, a single bidirectional channel 226 may support communications between the first IC device 202 and the second IC device 230. The forward channel 222 and/or the reverse channel 224 may be configurable to operate in a bidirectional mode when, for example, the forward and reverse channels 222 and 224 share the same physical connections and operate in a half-duplex manner. In one example, the communication link 220 may be operated to communicate control, command and other information between the first IC device 202 and the second IC device 230 in accordance with an industry or other standard.

The communication link 220 of FIG. 2 may be implemented according to MIPI Alliance specifications for C-PHY and may provide a wired bus that includes a plurality of signal wires (denoted as M wires). The M wires may be configured to carry N-phase encoded data in a high-speed digital interface, such as a mobile display digital interface (MDDI). The M wires may facilitate N-phase polarity encoding on one or more of the channels 222, 224 and 226. The physical layer drivers 210 and 240 may be configured or adapted to generate N-phase polarity encoded data for transmission on the communication link 220. The use of N-phase polarity encoding provides high speed data transfer and may consume half or less of the power of other interfaces because fewer drivers are active in N-phase polarity encoded data links.

N-phase polarity encoding devices 210 and/or 240 can typically encode multiple bits per transition on the communication link 220. In one example, a combination of 3-phase encoding and polarity encoding may be used to support a wide video graphics array (WVGA) 80 frames per second LCD driver IC without a frame buffer, delivering pixel data at 810 Mbps for display refresh.

Figure 3:
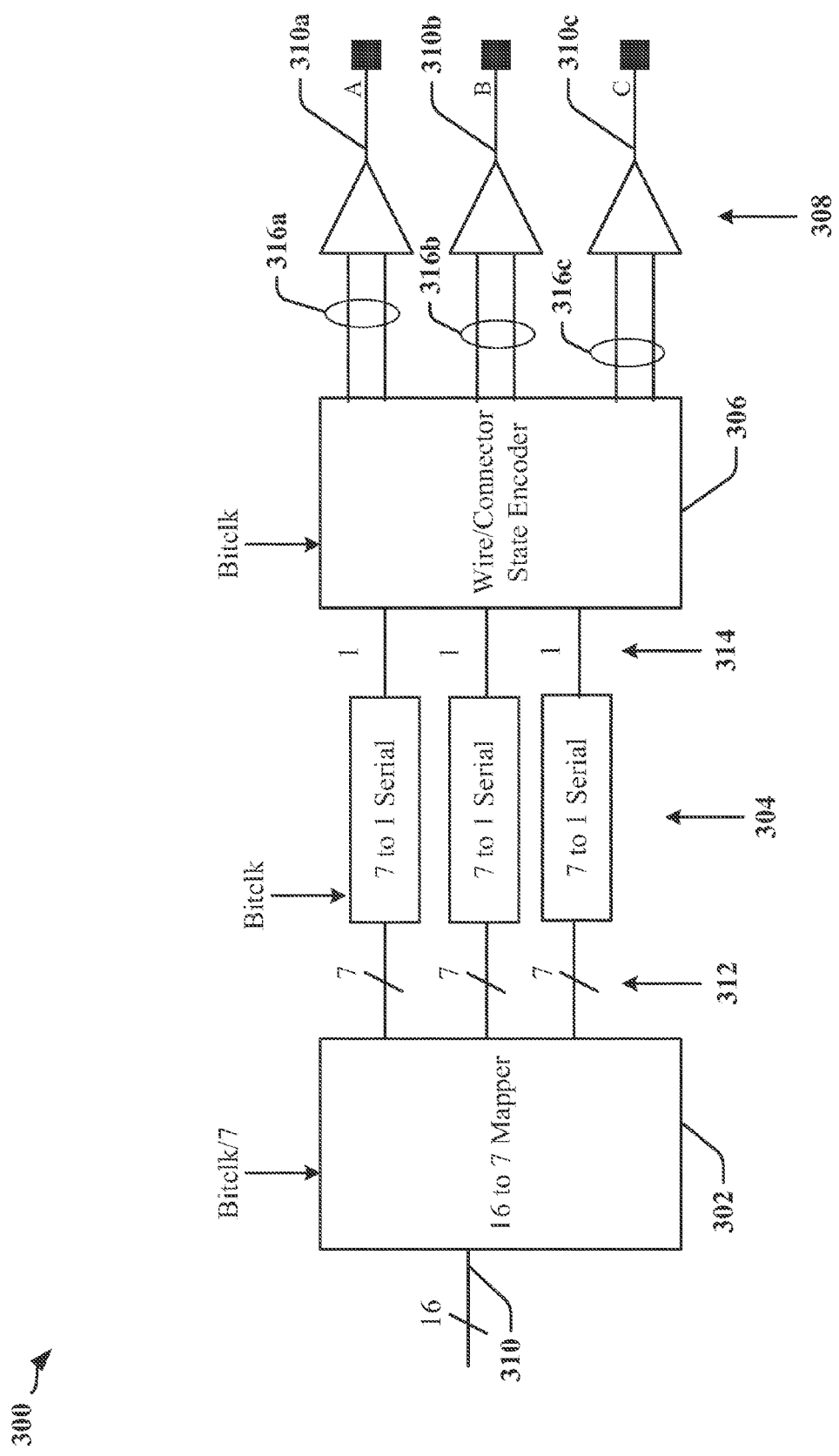
FIG. 3 illustrates a C-PHY 3-phase data encoder.

FIG. 3 is a schematic diagram 300 illustrating a 3-wire, 3-phase polarity encoder that may be used to implement certain aspects of the communication link 220 depicted in FIG. 2. The example of 3-wire, 3-phase encoding is selected solely for the purpose of simplifying descriptions of certain aspects of the invention. The principles and techniques disclosed for 3-wire, 3-phase encoders can be applied in other configurations of M-wire, N-phase polarity encoders.

Signaling states defined for each of the 3 wires in a 3-wire, 3-phase polarity encoding scheme may include an undriven state, a positively driven state and a negatively driven state. The positively driven state and the negatively driven state may be obtained by providing a voltage differential between two of the signal wires 310a, 310b and/or 310c, and/or by driving a current through two of the signal wires 310a, 310b and/or 310c connected in series such that the current flows in different directions in the two signal wires 310a, 310b and/or 310c. The undriven state may be realized by placing an output of a driver of a signal wire 310a, 310b or 310c in a high-impedance mode. Alternatively, or additionally, an undriven state may be obtained on a signal wire 310a, 310b or 310c by passively or actively causing an "undriven" signal wire 310a, 310b or 310c to attain a voltage level that lies substantially halfway between positive and negative voltage levels provided on driven signal wires 310a, 310b and/or 310c. Typically, there is no significant current flow through an undriven signal wire 310a, 310b or 310c. Signaling states defined for a 3-wire, 3-phase polarity encoding scheme may be denoted using the three voltage or current states (+1, −1, and 0).

A 3-wire, 3-phase polarity encoder may employ line drivers 308 to control the signaling state of signal wires 310a, 310b and 310c. The drivers 308 may be implemented as unit-level current-mode or voltage-mode drivers. In one example, each driver 308 may receive sets of two or more of signals 316a, 316b and 316c that determine the output state of corresponding signal wires 310a, 310b and 310c. In one example, the sets of two signals 316a, 316b and 316c may include a pull-up signal (PU signal) and a pull-down signal (PD signal) that, when high, activate pull-up and pull-down circuits that drive the signal wires 310a, 310b and 310c toward a higher level or lower level voltage, respectively. In this example, when both the PU signal and the PD signal are low, the signal wires 310a, 310b and 310c may be terminated to a mid-level voltage.

For each transmitted symbol interval in an M-wire, N-phase polarity encoding scheme, at least one signal wire 310a, 310b or 310c is in the midlevel/undriven (0) voltage or current state, while the number of positively driven (+1 voltage or current state) signal wires 310a, 310b or 310c is equal to the number of negatively driven (−1 voltage or current state) signal wires 310a, 310b or 310c, such that the sum of current flowing to the receiver is always zero. For each symbol, the state of at least one signal wire 310a, 310b or 310c is changed from the symbol transmitted in the preceding transmission interval.

In operation, a mapper 302 may receive and map 16-bit data 310 to 7 symbols 312. In the 3-wire example, each of the 7 symbols defines the states of the signal wires 310a, 310b and 310c for one symbol interval. The 7 symbols 312 may be serialized using parallel-to-serial converters 304 that provide a timed sequence of symbols 314 for each signal wire 310a, 310b and 310c. The sequence of symbols 314 is typically timed using a transmission clock. A 3-wire 3-phase encoder 306 receives the sequence of 7 symbols 314 produced by the mapper one symbol at a time and computes the state of each signal wire 310a, 310b and 310c for each symbol interval. The 3-wire encoder 306 selects the states of the signal wires 310a, 310b and 310c based on the current input symbol 314 and the previous states of signal wires 310a, 310b and 310c.

The use of M-wire, N-phase encoding permits a number of bits to be encoded in a plurality of symbols where the bits per symbol is not an integer. In the example of a 3-wire communications link, there are 3 available combinations of 2 wires, which may be driven simultaneously, and 2 possible combinations of polarity on the pair of wires that is driven, yielding 6 possible states. Since each transition occurs from a current state, 5 of the 6 states are available at every transition. The state of at least one wire is required to change at each transition. With 5 states, $\log_2(5) \cong 2.32$ bits may be encoded per symbol. Accordingly, a mapper may accept a 16-bit word and convert it to 7 symbols because 7 symbols carrying 2.32 bits per symbol can encode 16.24 bits. In other words, a combination of seven symbols that encode five states has $5^7$ (78,125) permutations. Accordingly, the 7 symbols may be used to encode the $2^{16}$ (65,536) permutations of 16 bits.

Figure 4:
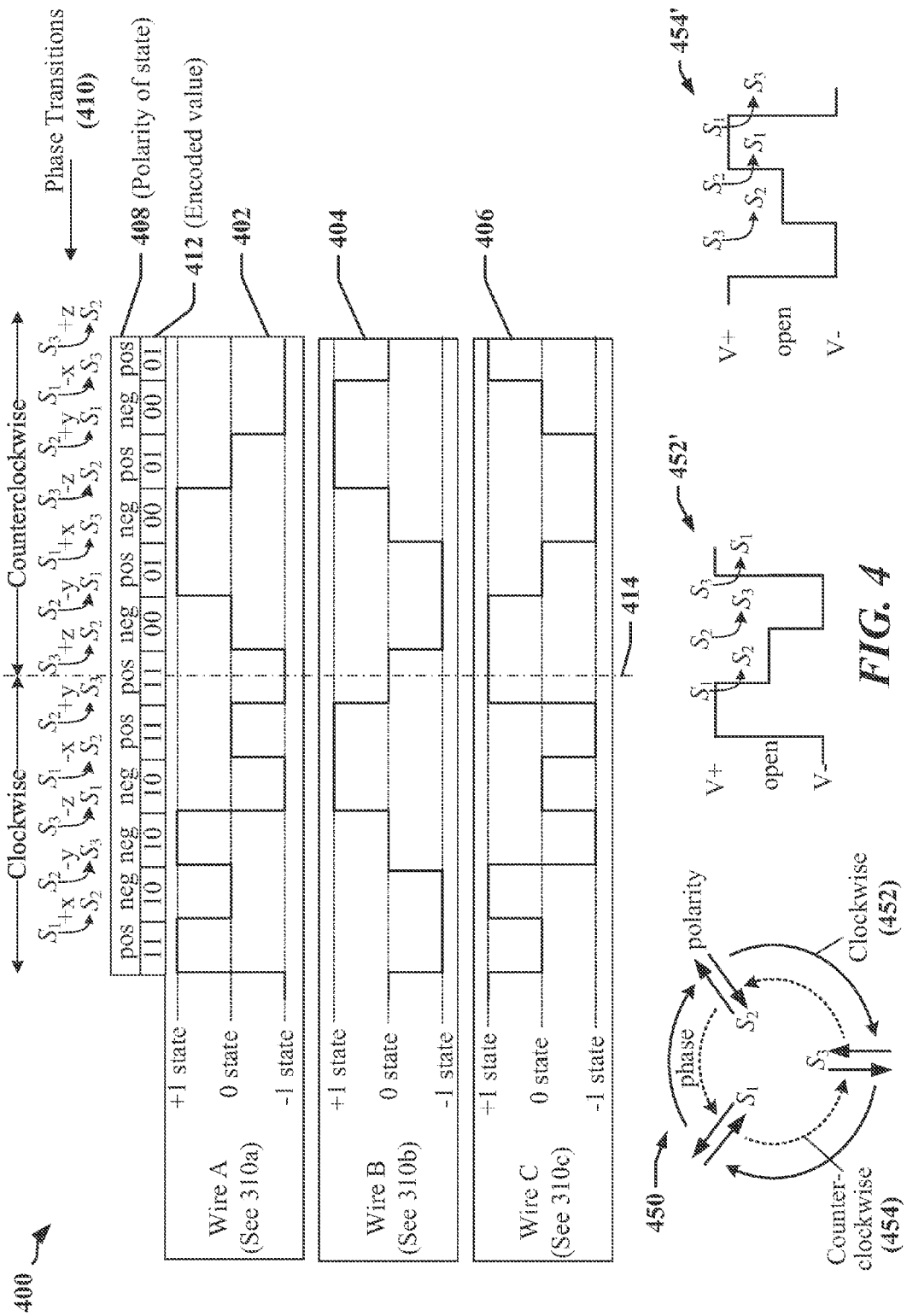
FIG. 4 illustrates signaling in a C-PHY 3-phase encoded interface.

FIG. 4 includes an example of a timing diagram 400 for signals encoded using a three-phase modulation data-encoding scheme, which is based on the circular state diagram 450. Information may be encoded in a sequence of signaling states where, for example, a wire or connector is in one of three phase states $S_1$, $S_2$ and $S_3$ defined by the circular state diagram 450. Each state may be separated from the other states by a 120° phase shift. In one example, data may be encoded in the direction of rotation of phase states on the wire or connector. The phase states in a signal may rotate in clockwise direction 452 and 452' or counterclockwise direction 454 and 454'. In the clockwise direction 452 and 452' for example, the phase states may advance in a sequence that includes one or more of the transitions from $S_1$ to $S_2$, from $S_2$ to $S_3$ and from $S_3$ to $S_1$. In the counterclockwise direction 454 and 454', the phase states may advance in a sequence that includes one or more of the transitions from $S_1$ to $S_3$, from $S_3$ to $S_2$ and from $S_2$ to $S_1$. The three signal wires 310a, 310b and 310c carry different versions of the same signal, where the versions may be phase shifted by 120° with respect to one another. Each signaling state may be represented as a different voltage level on a wire or connector and/or a direction of current flow through the wire or connector. During each of the sequence of signaling states in a 3-wire system, each signal wire 310a, 310b and 310c is in a different signaling states than the other wires. When more than 3 signal wires 310a, 310b and 310c are used in a 3-phase encoding system, two or more signal wires 310a, 310b and/or 310c can be in the same signaling state at each signaling interval, although each state is present on at least one signal wire 310a, 310b and/or 310c in every signaling interval.

Information may be encoded in the direction of rotation at each phase transition 410, and the 3-phase signal may change direction for each signaling state. Direction of rotation may be determined by considering which signal wires 310a, 310b and/or 310c are in the '0' state before and after a phase transition, because the undriven signal wire 310a, 310b and/or 310c changes at every signaling state in a rotating three-phase signal, regardless of the direction of rotation.

The encoding scheme may also encode information in the polarity 408 of the two signal wires 310a, 310b and/or 310c that are actively driven. At any time in a 3-wire implementation, exactly two of the signal wires 310a, 310b, 310c are driven with currents in opposite directions and/or with a voltage differential. In one implementation, data may be encoded using two bit values 412, where one bit is encoded in the direction of phase transitions 410 and the second bit is encoded in the polarity 408 for the current state.

The timing diagram 400 illustrates data encoding using both phase rotation direction and polarity. The curves 402, 404 and 406 relate to signals carried on three signal wires 310a, 310b and 310c, respectively for multiple phase states. Initially, the phase transitions 410 are in a clockwise direction and the most significant bit is set to binary '1,' until the rotation of phase transitions 410 switches at a time 414 to a counterclockwise direction, as represented by a binary '0' of the most significant bit. The least significant bit reflects the polarity 408 of the signal in each state.

According to certain aspects disclosed herein, one bit of data may be encoded in the rotation, or phase change in a 3-wire, 3-phase encoding system, and an additional bit may be encoded in the polarity of the two driven wires. Additional information may be encoded in each transition of a 3-wire, 3-phase encoding system by allowing transition to any of the possible states from a current state. Given 3 rotational phases and two polarities for each phase, 6 states are available in a 3-wire, 3-phase encoding system. Accordingly, 5 states are available from any current state, and there may be $\log_2(5) \cong 2.32$ bits encoded per symbol (transition), which allows the mapper 302 to accept a 16-bit word and encode it in 7 symbols.

N-Phase data transfer may use more than three wires provided in a communication medium, such as a bus. The use of additional signal wires that can be driven simultaneously provides more combinations of states and polarities and allows more bits of data to be encoded at each transition between states. This can significantly improve throughput of the system, and reduce the power consumption over approaches that use multiple differential pairs to transmit data bits, while providing increased bandwidth.

In one example, an encoder may transmit symbols using 6 wires with 2 pairs of wires driven for each state. The 6 wires may be labeled A through F, such that in one state, wires A and F are driven positive, wires B and E negative, and C and D are undriven (or carry no current). For six wires, there may be:

$$C(6, 4) = \frac{6!}{(6-4)! \cdot 4!} = 15$$

possible combinations of actively driven wires, with:

$$C(4, 2) = \frac{4!}{(4-2)! \cdot 2!} = 6$$

different combinations of polarity for each phase state.

The 15 different combinations of actively driven wires may include:

| | | | | |
|---|---|---|---|---|
| A B C D | A B C E | A B C F | A B D E | A B D F |
| A B E F | A C D E | A C D F | A C E F | A D E F |
| B C D E | B C D F | B C E F | B D E F | C D E F |

Of the 4 wires driven, the possible combinations of two wires driven positive (and the other two must be negative). The combinations of polarity may include:

| | | | | | |
|---|---|---|---|---|---|
| ++−− | +−−+ | +−+− | −+−+ | −++− | −−++ |

Accordingly, the total number of different states may be calculated as 15×6=90. To guarantee a transition between symbols, 89 states are available from any current state, and the number of bits that may be encoded in each symbol may be calculated as: $\log_2(89) \cong 6.47$ bits per symbol. In this example, a 32-bit word can be encoded by the mapper into 5 symbols, given that 5×6.47=32.35 bits.

The general equation for the number of combinations of wires that can be driven for a bus of any size, as a function of the number of wires in the bus and number of wires simultaneously driven:

$$C(N_{wires}, N_{driven}) = \frac{N_{wires}!}{(N_{wires} - N_{driven})! \cdot N_{driven}!}$$

one equation for calculating the number of combinations of polarity for the wires being driven is:

$$C\left(N_{driven}, \frac{N_{driven}}{2}\right) = \frac{N_{driven}!}{\left(\left(\frac{N_{driven}}{2}\right)!\right)^2}$$

The equivalent number of bits per symbol may be stated as:

$$\log_2\left(C(N_{wires}, N_{driven}) \cdot C\left(N_{driven}, \frac{N_{driven}}{2}\right) - 1\right)$$

Figure 5:
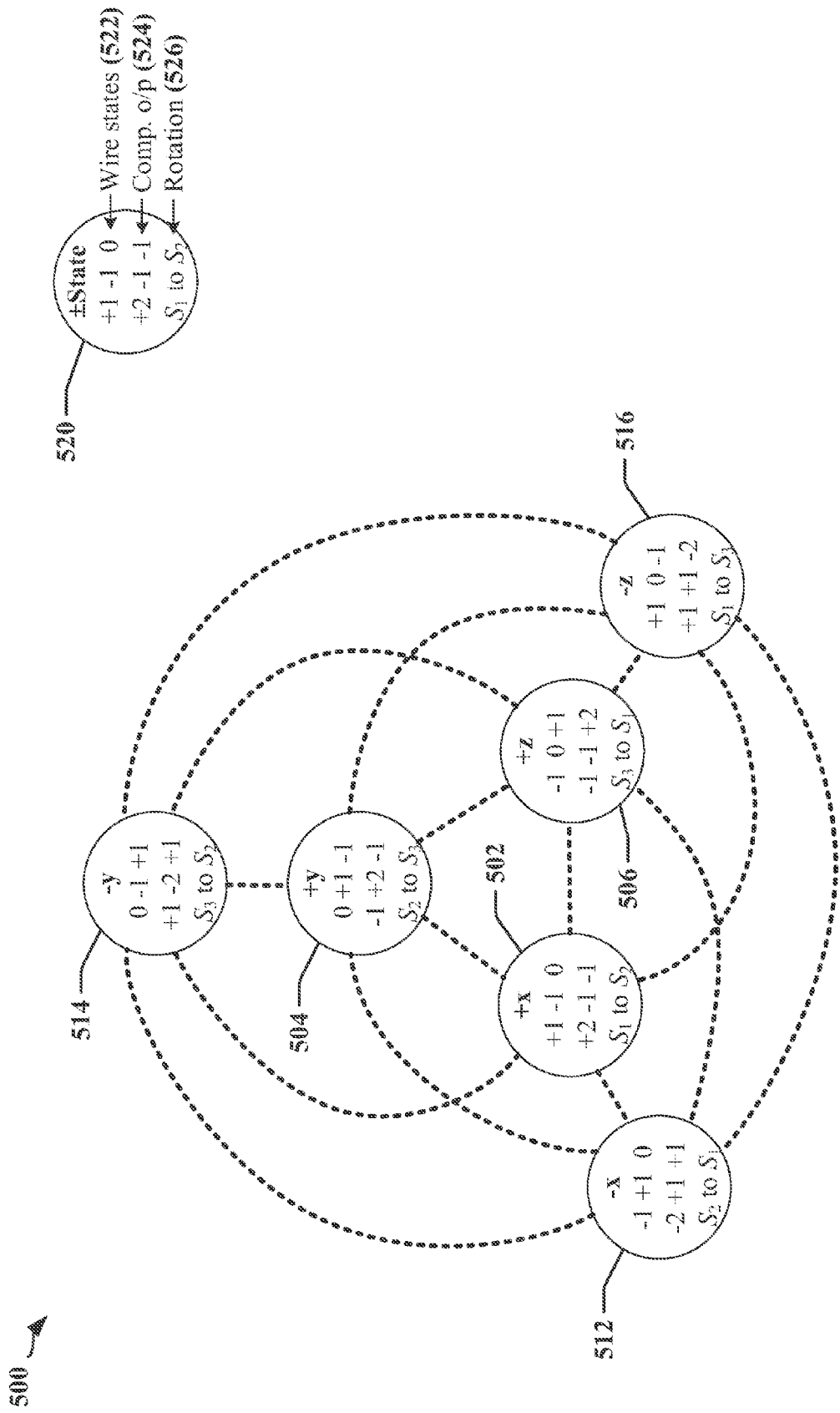
FIG. 5 is a state diagram illustrating potential state transitions in a C-PHY 3-phase encoded interface.

FIG. 5 is a state diagram 500 illustrating 6 states and 30 possible state transitions in one example of a 3-wire, 3-phase communication link. The possible states 502, 504, 506, 512, 514 and 516 in the state diagram 500 include and expand on the states shown in the circular state diagram 450 of FIG. 4. As shown in the exemplar of a state element 520, each state 502, 504, 506, 512, 514 and 516 in the state diagram 500 includes a field 522 showing the voltage state of signals A, B and C (transmitted on signal wires 310a, 310b and 310c respectively), a field 524 showing the result of a subtraction of wire voltages by differential receivers (see the differential receivers 602 of FIG. 6, for example), respectively and a field 526 indicating the direction of rotation. For example, in state 502 (+x) wire A=+1, wire B=−1 and wire C=0, yielding output of differential receiver 702a (A-B)=+2, differential receiver 702b (B-C)=−1 and differential receiver 702c (C-A) =+1. As illustrated by the state diagram, transition decisions taken by phase change detect circuitry in a receiver are based on 5 possible levels produced by differential receivers, which include −2, −1, 0, +1 and +2 voltage states.

Figure 6:
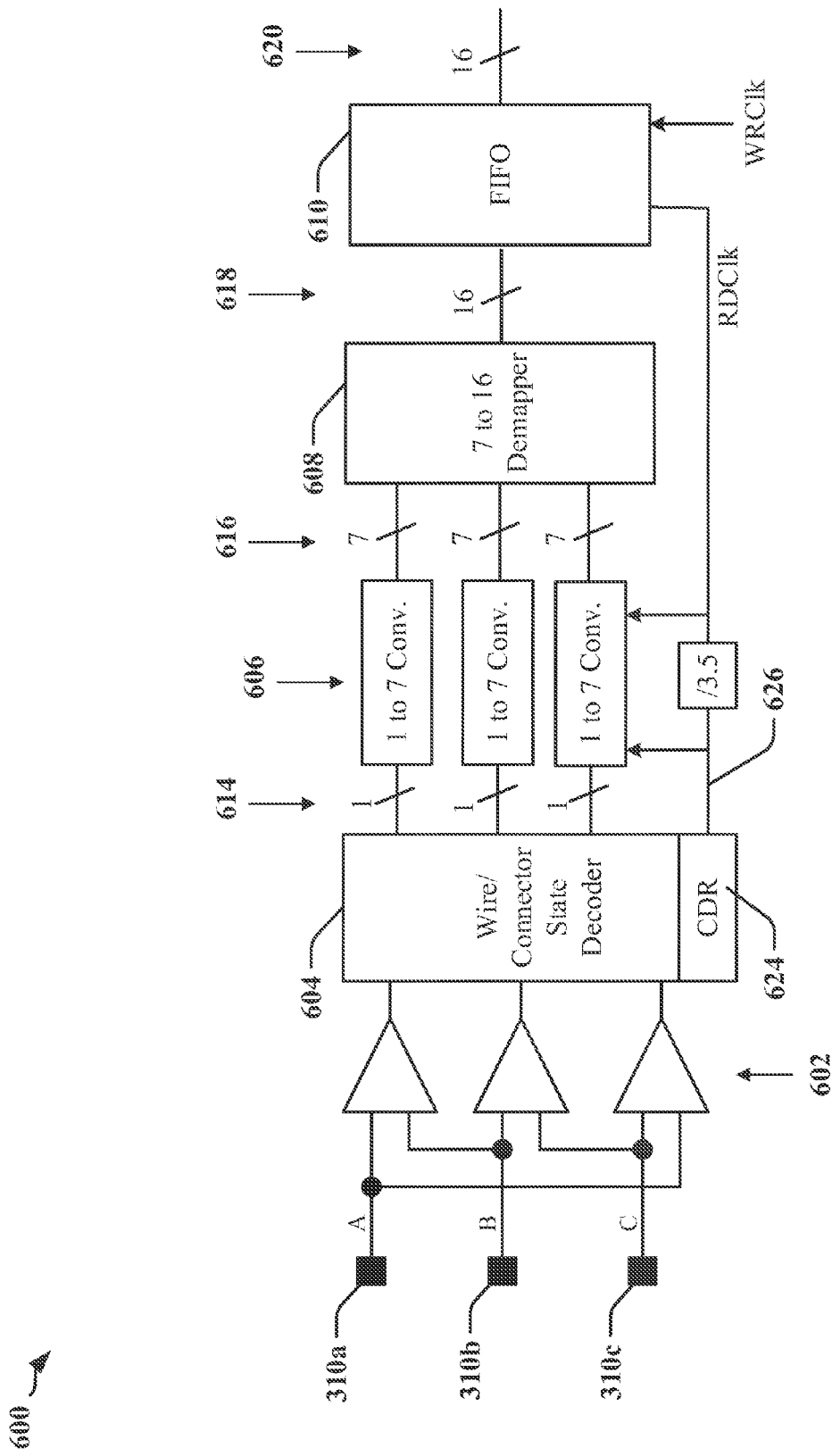
FIG. 6 illustrates a C-PHY decoder.

FIG. 6 is a diagram illustrating certain aspects of a 3-wire, 3-phase decoder 600. Differential receivers 602 and a wire state decoder 604 are configured to provide a digital representation of the state of the three transmission lines (e.g., the signal wires 310a, 310b and 310c illustrated in FIG. 3), with respect to one another, and to detect changes in the state of the three transmission lines compared to the state transmitted in the previous symbol period. Seven consecutive states are assembled by the serial-to-parallel convertors 606 to obtain a set of 7 symbols to be processed by the demapper 608. The demapper 608 produces 16 bits of data that may be buffered in a first-in-first-out (FIFO) register 610.

The wire state decoder 604 may extract a sequence of symbols 614 from phase encoded signals received on the signal wires 310a, 310b and 310c. The symbols 614 are encoded as a combination of phase rotation and polarity as disclosed herein. The wire state decoder may include a CDR circuit 624 that extracts a clock 626 that can be used to reliably capture symbols from the signal wires 310a, 310b and 310c. A transition occurs on least one of the signal wires 310a, 310b and 310c at each symbol boundary and the CDR circuit 624 may be configured to generate the clock 626 based on the occurrence of a transition or multiple transitions. An edge of the clock may be delayed to allow time for all signal wires 310a, 310b and 310c to have stabilized and to thereby ensure that the current symbol is captured for decoding purposes.

Jitter in 3-Phase Interfaces

A 3-phase transmitter includes drivers that provide high, low and middle-level voltages onto the transmit channel. This results in some variable transitions between consecutive symbol intervals. Low-to-high and high-to-low voltage transitions may be referred to as full-swing transitions, while low-to-middle and high-to-middle voltage transitions may be referred to as half-swing transitions. Different types of transitions may have different rise or fall times, and may result in different zero crossings at the receiver. These differences can result in "encoding jitter," which may impact link signal integrity performance.

Figure 7:
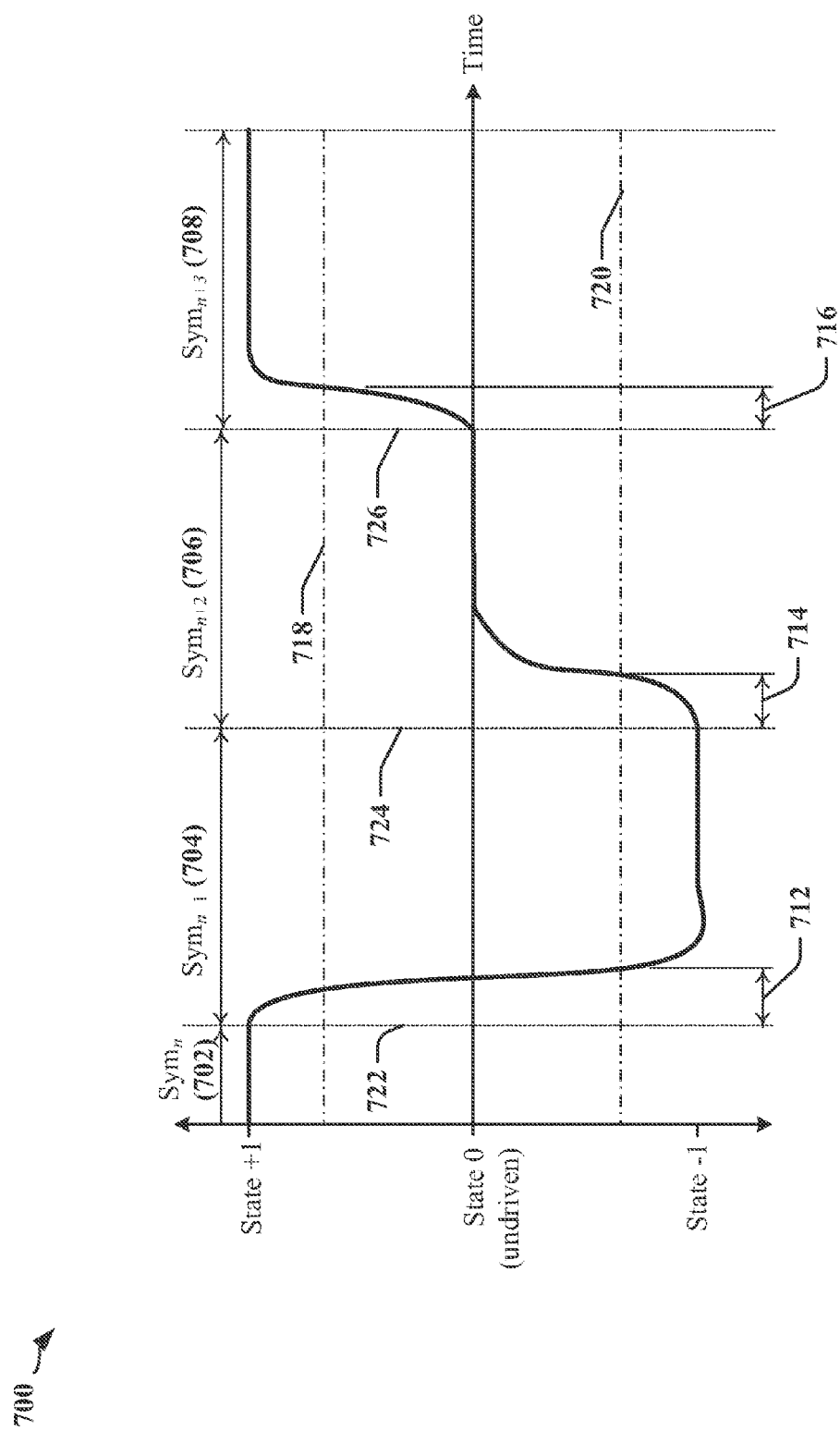
FIG. 7 is an example of the effects of signal rise times on transition detection in a C-PHY decoder.

FIG. 7 is a timing diagram 700 that illustrates certain aspects of transition variability at the output of a C-PHY 3-phase transmitter. Variability in signal transition times may be attributed to the existence of the different voltage and/or current levels used in 3-phase signaling. The timing diagram 700 illustrates transition times in a signal received from a single signal wire 310a, 310b or 310c. A first symbol $Sym_n$ 702 is transmitted in a first symbol interval that ends at a time 722 when a second symbol $Sym_{n+1}$ 724 is transmitted in a second symbol interval. The second symbol interval may end at time 726 when a third symbol $Sym_{n+2}$ 706 is transmitted in the third symbol interval, which ends when a fourth symbol $Sym_{n+3}$ 708 is transmitted in a fourth symbol interval. The transition from a state determined by the first symbol 702 to the state corresponding to the second symbol 704 may be detectable after a delay 712 attributable to the time taken for voltage in the signal wire 310a, 310b or 310c to reach a threshold voltage 718 and/or 720. The threshold voltages may be used to determine the state of the signal wire 310a, 310b or 310c. The transition from a state determined by the second symbol 704 to the state for the third symbol 706 may be detectable after a delay 714 attributable to the time taken for voltage in the signal wire 310a, 310b or 310c to reach one of the threshold voltages 718 and/or 720. The transition from a state determined by the third symbol 706 to the state for the fourth symbol 708 may be detectable after a delay 716 attributable to the time taken for voltage in the signal wire 310a, 310b or 310c to reach a threshold voltage 718 and/or 720. The delays 712, 714 and 716 may have different durations, which may be attributable in part to variations in device manufacturing processes and operational conditions, which may produce unequal effects on transitions between different voltage or current levels associated with the 3 states and/or different transition magnitudes. These differences may contribute to jitter and other issues in C-PHY 3-phase receiver.

Figure 8:
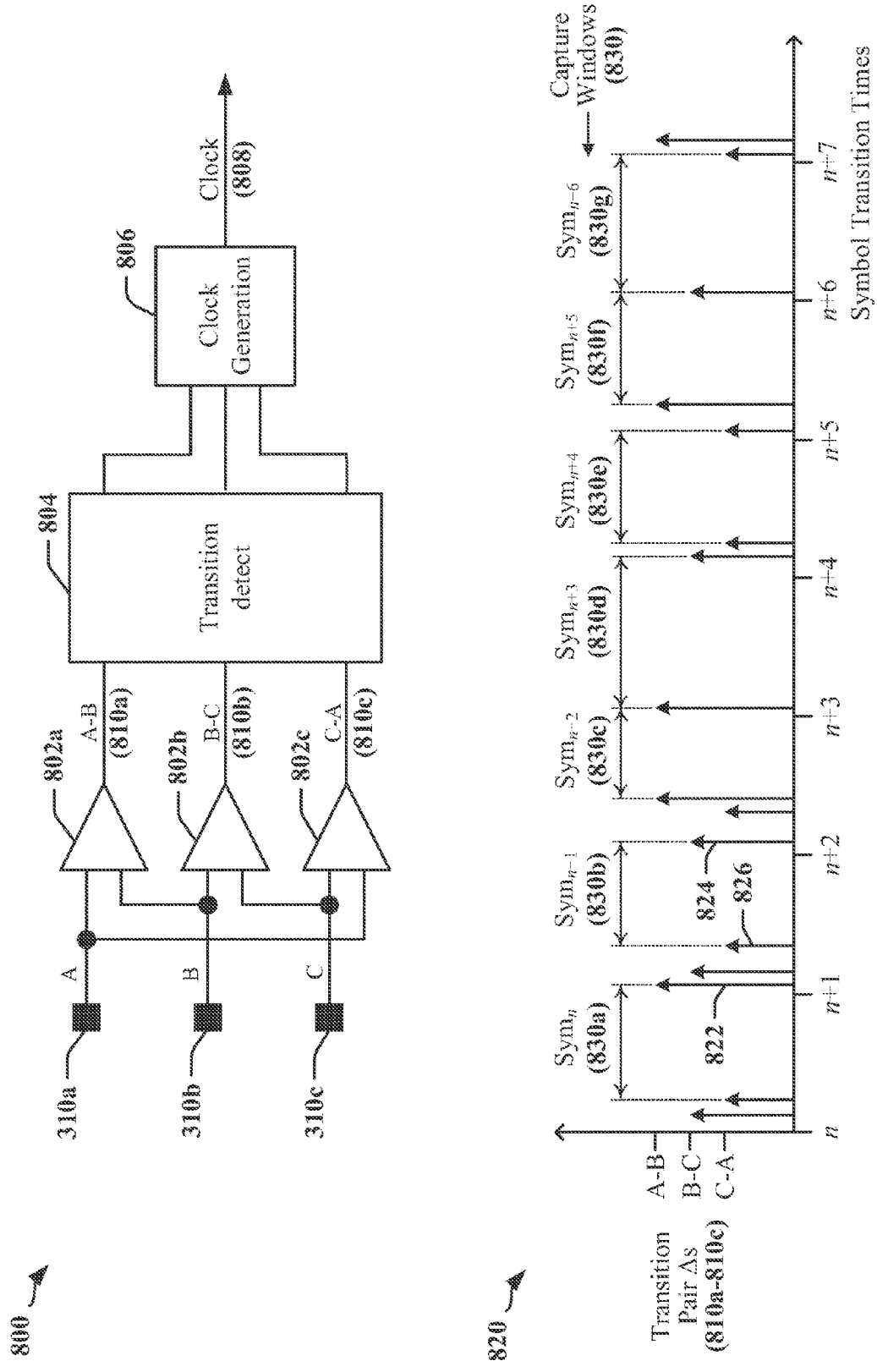
FIG. 8 illustrates transition detection in a C-PHY decoder.

FIG. 8 includes a block schematic 800 illustrating certain aspects of CDR circuits that may be provided in a receiver in a C-PHY 3-phase interface. A set of differential receivers 802a, 802b and 802c is configured to generate a set of difference signals 810a, 810b, 810c by comparing each of the three signal wires 310a, 310b and 310c in a trio with the other of the three signal wires 310a, 310b and 310c in the trio. In the example depicted, a first differential receiver 802a compares the states of signal wires 310a and 310b, a second differential receiver 802b compares the states of signal wires 310b and 310c and a third differential receiver 802c compares the states of signal wires 310a and 310c. Accordingly, a transition detection circuit 804 can be configured to detect occurrence of a phase change because the output of at least one of the differential receivers 802a, 802b and 802c changes at the end of each symbol interval.

Certain transitions between transmitted symbols may be detectable by a single differential receiver 802a, 802b or 802c, while other transitions may be detected by two or more of the differential receivers 802a, 802b and 802c. In one example the states, or relative states of two wires may be unchanged after a transition and the output of a corresponding differential receiver 802a, 802b or 802c may also be unchanged after the phase transition. In another example, both wires in a pair of signal wires 310a, 310b and/or 310c may be in the same state in a first time interval and both wires may be in a same second state in a second time interval and the corresponding differential receiver 802a, 802b or 802c may be unchanged after the phase transition. Accordingly, a clock generation circuit 806 may include a transition detection circuit 804 and/or other logic to monitor the outputs of all differential receivers 802a, 802b and 802c in order to determine when a phase transition has occurred. The clock generation circuit may generate a receive clock signal 808 based on detected phase transitions.

Changes in signaling states of the 3 wires may be detected at different times for different combinations of the signal wires 310a, 310b and/or 310c. The timing of detection of signaling state changes may vary according to the type of signaling state change that has occurred. The result of such variability is illustrated in the timing diagram 820 of FIG. 8. Markers 822, 824 and 826 represent occurrences of transitions in the difference signals 810a, 810b, 810c provided to the transition detection circuit 804. The markers 822, 824 and 826 are assigned different heights in the timing diagram 820 for clarity of illustration only, and the relative heights of the markers 822, 824 and 826 are not intended to show a specific relationship to voltage or current levels, polarity or weighting values used for clock generation or data decoding. The timing diagram 820 illustrates the effect of timing of transitions associated with symbols transmitted in phase and polarity on the three signal wires 310a, 310b and 310c. In the timing diagram 820, transitions between some symbols may result in variable capture windows 830a, 830b, 830c, 830d, 830e, 830f and/or 830g (collectively symbol capture windows 830) during which symbols may be reliably captured. The number of state changes detected and their relative timing can result in jitter on the clock signal 808.

The throughput of a C-PHY communications link may be affected by duration and variability in signal transition times. For example, variability in detection circuits may be caused by manufacturing process tolerances, variations and stability of voltage and current sources and operating temperature, as well as by the electrical characteristics of the signal wires 310a, 310b and 310c. The variability in detection circuits may limit channel bandwidth.

Figure 9:
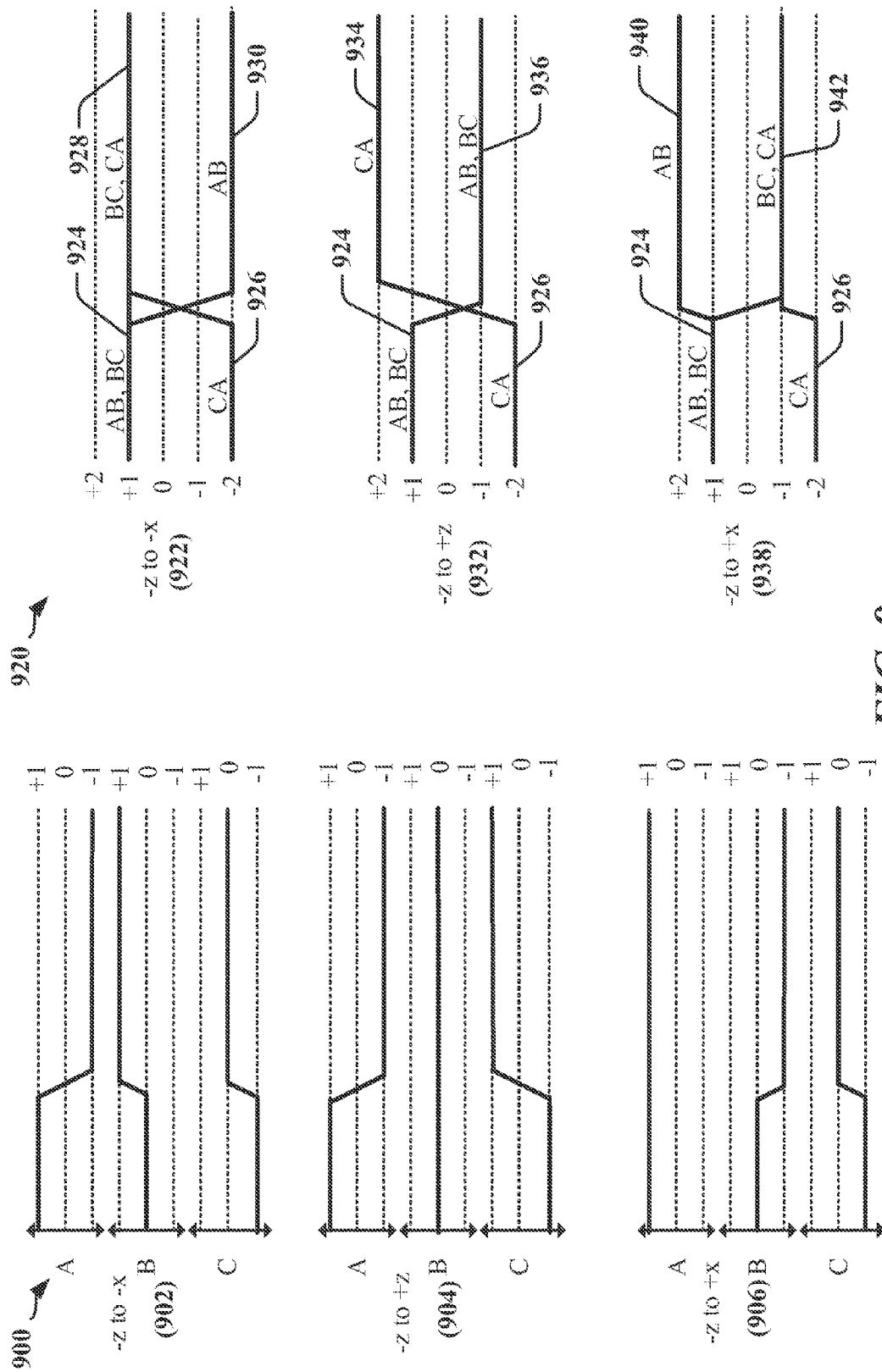
FIG. 9 illustrates one example of signal transitions occurring between pairs of consecutive symbols transmitted on a C-PHY interface.

FIG. 9 includes timing diagrams 900 and 920 representative of certain examples of transitions from a first signaling state to a second signaling state between certain consecutive symbols. The signaling state transitions illustrated in the timing diagrams 900 and 920 are selected for illustrative purposes, and other transitions and combinations of transitions can occur in a MIPI Alliance C-PHY interface. The timing diagrams 900 and 920 relate to an example of a 3-wire, 3-phase communications link, in which multiple receiver output transitions may occur at each symbol interval boundary due to differences in rise and fall time between the signal levels on the trio of wires. With reference also to FIG. 8, the first timing diagrams 900 illustrate the signaling states of the trio of signal wires 310a, 310b and 310c (A, B, and C) before and after a transition and second timing diagrams 920 illustrate the outputs of the differential receivers 802a, 802b and 802c, which provides difference signals 810a, 810b, 810c representative of the differences between signal wires 310a, 310b and 310c. In many instances, a set of differential receivers 802a, 802b and 802c may be configured to capture transitions by comparing different combinations for two signal wires 310a, 310b and 310c. In one example, these differential receivers 802a, 802b and 802c may be configured to produce outputs by determining the difference (e.g. by subtraction) of their respective input voltages.

In each of the examples shown in the timing diagrams 900 and 920, the initial symbol (−z) 516 (see FIG. 8) transitions to a different symbol. As shown in the timing diagrams 902, 904 and 906 signal A is initially in a +1 state, signal B is in a 0 state and signal C is in the −1 state. Accordingly, the differential receivers 802a, 802b initially measure a +1 difference 924 and the differential receiver 802c measures a −2 difference 926, as shown in the timing diagrams 922, 932, 938 for the differential receiver outputs.

In a first example corresponding to the timing diagrams 902, 922, a transition occurs from symbol (−z) 516 to symbol (−x) 512 (see FIG. 8) in which signal A transitions to a −1 state, signal B transitions to a +1 state and signal C transitions to a 0 state, with the differential receiver 802a transitioning from +1 difference 924 to a −2 difference 930, differential receiver 802b remaining at a +1 difference 924, 928 and differential receiver 802c transitioning from −2 difference 926 to a +1 difference 928.

In a second example corresponding to the timing diagrams 904, 932, a transition occurs from symbol (−z) 516 to symbol (+z) 506 in which signal A transitions to a −1 state, signal B remains at the 0 state and signal C transitions to a +1 state, with two differential receivers 802a and 802b transitioning from +1 difference 924 to a −1 difference 936, and differential receiver 802c transitioning from −2 difference 926 to a +2 difference 934.

In a third example corresponding to the timing diagrams 906, 938, a transition occurs from symbol (−z) 516 to symbol (+x) 502 in which signal A remains at the +1 state, signal B transitions to the −1 state and signal C transitions to a 0 state, with the differential receiver 802a transitioning from a +1 difference 924 to a +2 difference 940, the differential receiver 802b transitioning from a +1 difference 924 to a −1 difference 942, and the differential receiver 802c transitioning from −2 difference 926 to a −1 difference 942.

These examples illustrate transitions in difference values spanning 0, 1, 2, 3, 4 and 5 levels. Pre-emphasis techniques used for typical differential or single-ended serial transmitters were developed for two level transitions and may introduce certain adverse effects if used on a MIPI Alliance C-PHY 3-phase signal. In particular, a pre-emphasis circuit that overdrives a signal during transitions may cause overshoot during transitions spanning 1 or 2 levels and may cause false triggers to occur in edge sensitive circuits.

Figure 10:
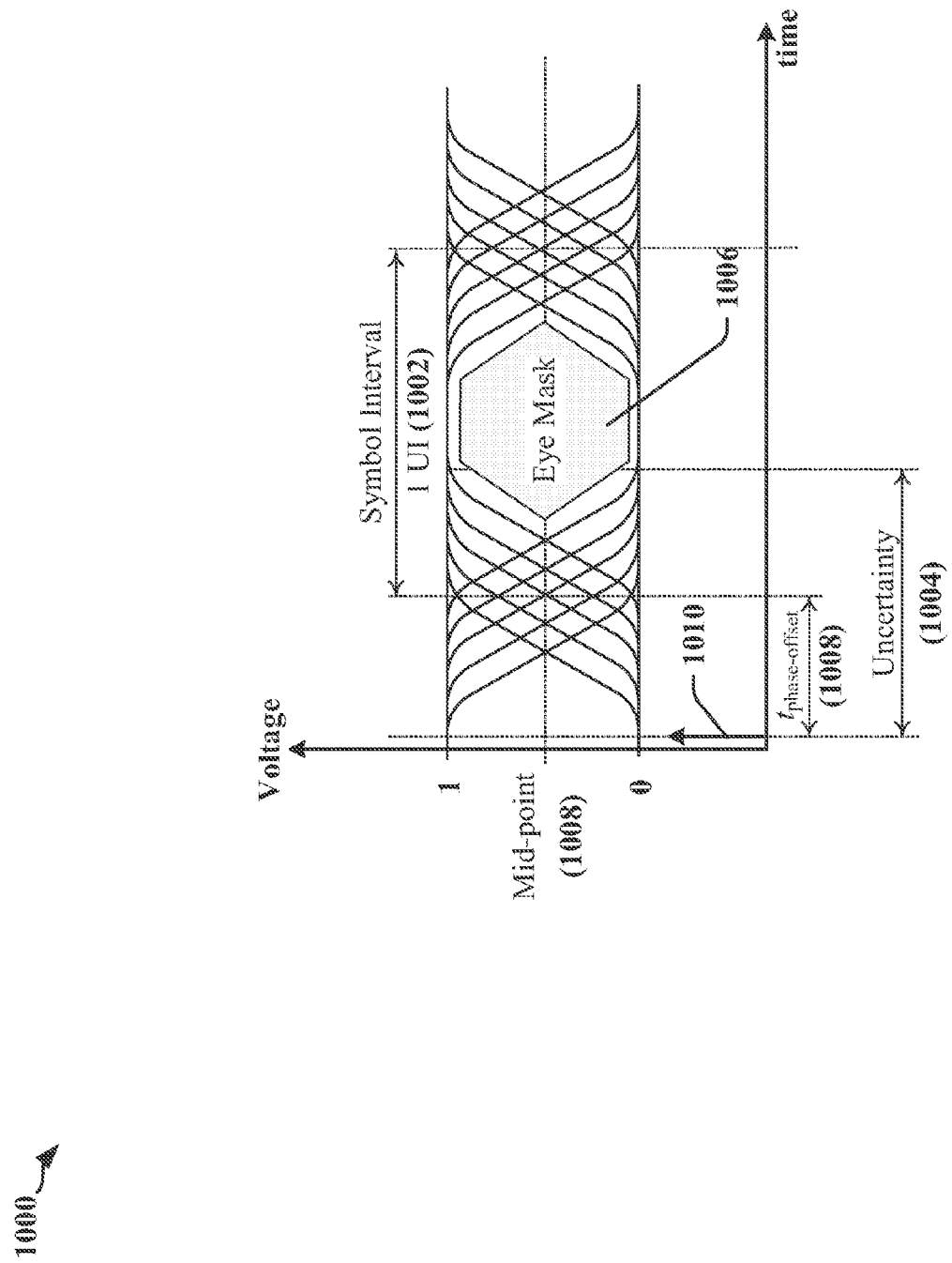
FIG. 10 illustrates transition regions and eye regions in an eye-pattern.

FIG. 10 illustrates an eye pattern 1000 generated as an overlay of multiple symbol intervals, including a single symbol interval 1002. A signal transition region 1004 represents a time period of uncertainty at the boundary between two symbols where variable signal rise times prevent reliable decoding. State information may be determined reliably in a region defined by an eye mask 1006 within an "eye opening" that represents the time period in which the symbol is stable and can be reliably received and decoded. The eye mask 1006 masks off a region in which zero crossings do not occur, and the eye mask is used by the decoder to prevent multiple clocking due to the effect of subsequent zero crossings at the symbol interval boundary that follow the first signal zero crossing.

The concept of periodic sampling and display of the signal is useful during design, adaptation and configuration of systems which use a clock-data recovery circuit that re-creates the received data-timing signal using frequent transitions appearing in the received data. A communication system based on Serializer/Deserializer (SERDES) technology is an example of a system where an eye pattern 1000 can be utilized as a basis for judging the ability to reliably recover data based on the eye opening of the eye pattern 1000.

An M-wire N-Phase encoding system, such as a 3-wire, 3-phase encoder may encode a signal that has at least one transition at every symbol boundary and the receiver may recover a clock using those guaranteed transitions. The receiver may require reliable data immediately prior to the first signal transition at a symbol boundary, and must also be able to reliably mask any occurrences of multiple transitions that are correlated to the same symbol boundary. Multiple receiver transitions may occur due to slight differences in rise and fall time between the signals carried on the M-wires (e.g. a trio of wires) and due to slight differences in signal propagation times between the combinations of signal pairs received (e.g. A-B, B-C, and C-A outputs of differential receivers 802a, 802b and 802c of FIG. 6).

Figure 11:
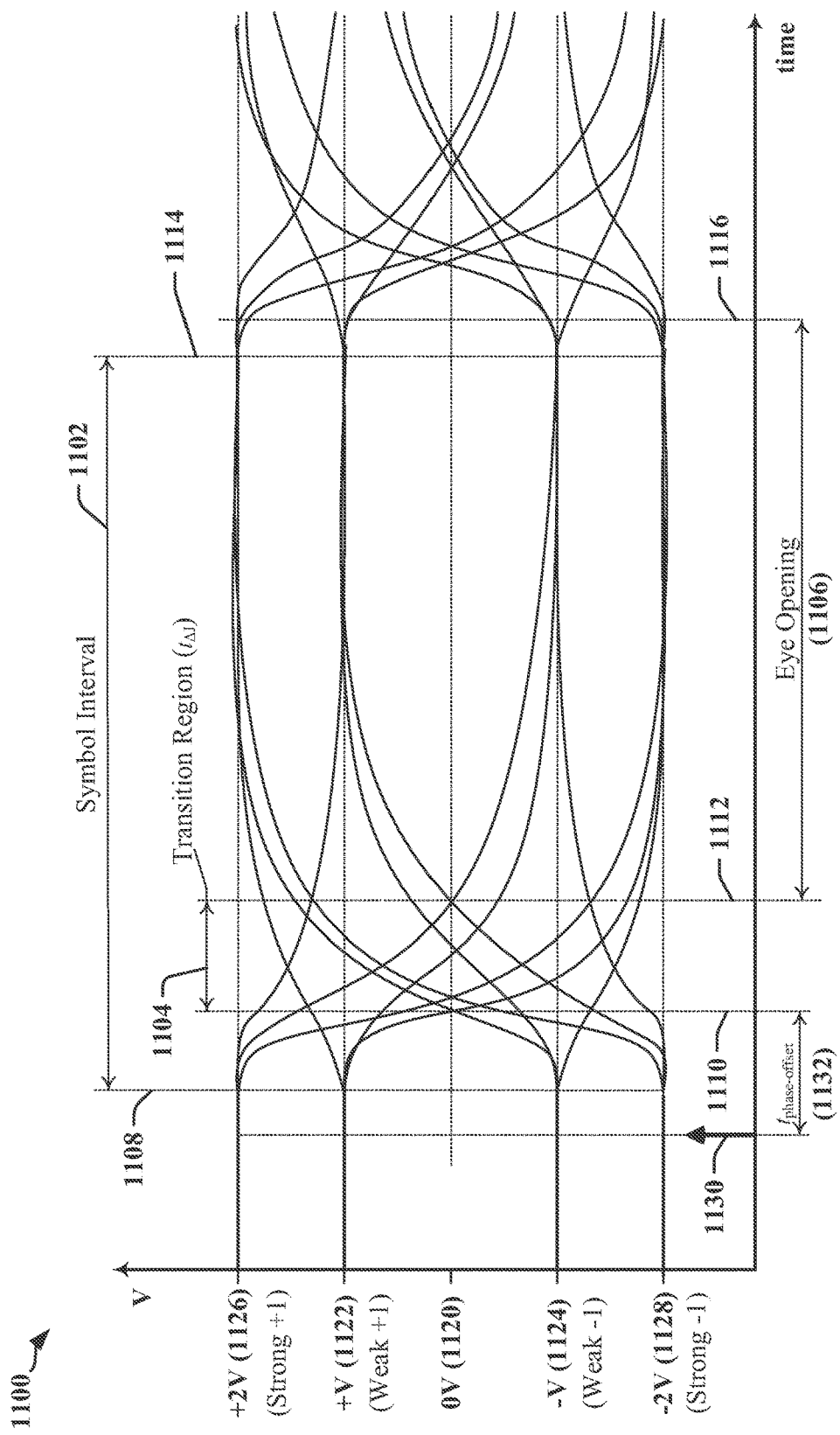
FIG. 11 illustrates an example of an eye-pattern generated for a C-PHY 3-Phase interface.

FIG. 11 illustrates an example of an eye-pattern 1100 generated for a C-PHY 3-phase signal. The eye-pattern 1100 may be generated from an overlay of multiple symbol intervals 1102. The eye-pattern 1100 may be produced using a fixed and/or symbol-independent trigger 1130. The eye-pattern 1100 includes an increased number of voltage levels 1120, 1122, 1124, 1126, 1128 that may be attributed to the multiple voltage levels measured by the differential receivers 802a, 802b, 802c an N-phase receiver circuit (see FIG. 8). In the example, the eye-pattern 1100 may correspond to possible transitions in 3-wire, 3-phase encoded signals provided to the differential receivers 802a, 802b, and 802c. The three voltage levels may cause the differential receivers 802a, 802b, and 802c to generate strong voltage levels 1126, 1128 and weak voltage levels 1122, 1124 for both positive and negative polarities. Typically, only one signal wire 310a, 310b and 310c is undriven in any symbol and the differential receivers 802a, 802b, and 802c do not produce a 0 state (here, 0 Volts) output. The voltages associated with strong and weak levels need not be evenly spaced with respect to a 0 Volts level. For example, the weak voltage levels 1122, 1124 represent a comparison of voltages that may include the voltage level reached by an undriven signal wire 310a, 310b and 310c. The eye-pattern 1100 may overlap the waveforms produced by the differential receivers 802a, 802b, and 802c because all three pairs of signals are considered simultaneously when data is captured at the receiving device. The waveforms produced by the differential receivers 802a, 802b, and 802c are representative of difference signals 810a, 810b, 810c representing comparisons of three pairs of signals (A-B, B-C, and C-A).

Drivers, receivers and other devices used in a C-PHY 3-Phase decoder may exhibit different switching characteristics that can introduce relative delays between signals received from the three wires. Multiple receiver output transitions may be observed at each symbol interval boundary 1108 and/or 1114 due to slight differences in the rise and fall time between the three signals of the trio of signal wires 310a, 310b, 310c and due to slight differences in signal propagation times between the combinations of pairs of signals received from the signal wires 310a, 310b, 310c. The eye-pattern 1100 may capture variances in rise and fall times as a relative delay in transitions near each symbol interval boundary 1108 and 1114. The variances in rise and fall times may be due to the different characteristics of the 3-Phase drivers. Differences in rise and fall times may also result in an effective shortening or lengthening of the duration of the symbol interval 1102 for any given symbol.

A signal transition region 1104 represents a time, or period of uncertainty, where variable signal rise times prevent reliable decoding. State information may be reliably determined in an "eye opening" 1106 representing the time period in which the symbol is stable and can be reliably received and decoded. In one example, the eye opening 1106 may be determined to begin at the end 1112 of the signal transition region 1104, and end at the symbol interval boundary 1114 of the symbol interval 1102. In the example depicted in FIG. 11, the eye opening 1106 may be determined to begin at the end 1112 of the signal transition region 1104, and end at a time 1116 when the signaling state of the signal wires 310a, 310b, 310c and/or the outputs of the three differential receivers 802a, 802b and 802c have begun to change to reflect the next symbol.

The maximum speed of a communication link 220 configured for N-Phase encoding may be limited by the duration of the signal transition region 1104 compared to the eye opening 1106 corresponding to the received signal. The minimum period for the symbol interval 1102 may be constrained by tightened design margins associated with the CDR circuit 624 in the decoder 600 illustrated in FIG. 6, for example. Different signaling state transitions may be associated with different variations in signal transition times corresponding to two or more signal wires 310a, 310b and/or 310c, thereby causing the outputs of the differential receivers 802a, 802b and 802c in the receiving device to change at different times and/or rates with respect to the symbol interval boundary 1108, where the inputs of the differential receivers 802a, 802b and 802c begin to change. The differences between signal transition times may result in timing skews between signaling transitions in two or more difference signals 810a, 810b, 810c. CDR circuits may include delay elements and other circuits to accommodate timing skews between the difference signals 810a, 810b, 810c.

Figure 12:
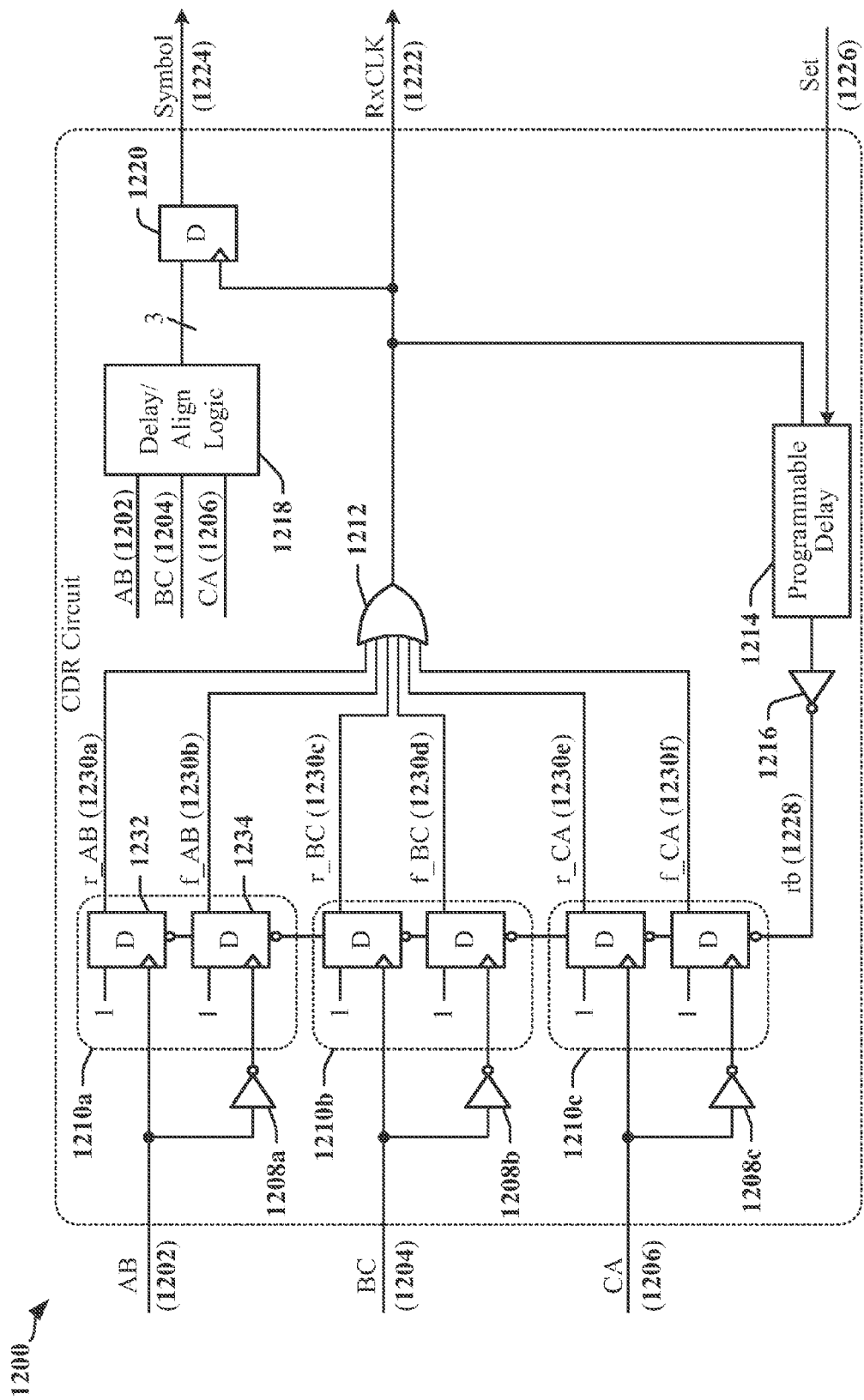
FIG. 12 illustrates an example of a CDR circuit for a C-PHY 3-Phase interface.

FIG. 12 provides an example of a CDR circuit 1200 for a 3-wire, 3-phase interface. The illustrated CDR circuit 1200 includes certain features and functional elements that are common to many different types of clock recovery circuits. The CDR circuit 1200 receives difference signals 1202, 1204, 1206, which may be derived from the difference signals 810a, 810b, 810c produced by the differential receivers 802a, 802b and 802c of FIG. 8 for example. In the CDR circuit 1200, each difference signal 1202, 1204, 1206 clocks a pair of D flip-flops 1210a, 1210b, 1210c to produce output signals 1230a-1230f. The output signals 1230a-1230f carry a pulse when a transition is detected on the corresponding difference signal 1202, 1204, 1206. A rising edge provided to a clock input on a D flip-flop clocks a logic one through the D flip-flop. Inverters 1208a, 1208b, 1208c may be used to provide inverted versions of the difference signals 1202, 1204, 1206 to one of the D flip-flops in each corresponding pair of D flip-flops 1210a, 1210b, 1210c. Accordingly, each pair of D flip-flops 1210a, 1210b, 1210c produces pulses responsive to rising edge and falling edges detected in the corresponding difference signal 1202, 1204, 1206.

For example, the AB difference signal 1202 is provided to a first D flip-flop 1232 of a first pair of D flip-flops 1210a, and the inverter 1208a provides an inverted version of the AB difference signal 1202 to a second D flip-flop 1234 of the first pair of D flip-flops 1210a. The D flip-flops are initially in a reset state. A rising edge on the AB difference signal 1202 clocks a logic one through the first D flip-flop 1232 causing the output of the first flip-flop (r_AB) 1230a to transition to a logic one state. A falling edge on the AB difference signal 1202 clocks a logic one through the second D flip-flop 1234 causing the output of the second flip-flop (f_AB) 1230b to transition to a logic one state.

The output signals 1230a-1230f are provided to logic, such as the OR gate 1212, which produces an output signal that may serve as the receiver clock (RxCLK) signal 1222. The RxCLK signal 1222 transitions to a logic one state when a transition occurs in signaling state of any of the difference signals 1202, 1204, 1206. The RxCLK signal 1222 is provided to a programmable delay element 1214, which drives a reset signal (rb) 1228 that resets the D flip-flops in the pairs of D flip-flops 1210a, 1210b, 1210c. In the illustrated example, an inverter 1216 may be included when the D flip-flops are reset by a low signal. When the D flip-flops are reset, the output of the OR gate 1212 returns to the logic zero state and the pulse on the RxCLK signal 1222 is terminated. When this logic zero state propagates through the programmable delay element 1214 and the inverter 1216, the reset condition on the D flip-flops is released. While the D flip-flops are in the reset condition, transitions on the difference signals 1202, 1204, 1206 are ignored.

The programmable delay element 1214 is typically configured to produce a delay that has a duration that exceeds the difference in the timing skew between the occurrence of first and last transitions on the difference signals 1202, 1204, 1206. The programmable delay element 1214 configures the duration of pulses (i.e., the pulse width) on the RxCLK signal 1222. The programmable delay element 1214 may be configured when a Set signal 1226 is asserted by a processor or other control and/or configuration logic.

The RxCLK signal 1222 may also be provided to a set of three flip-flops 1220 that capture the signaling state of the difference signals 1202, 1204, 1206, providing a stable output symbol 1224 for each pulse that occurs on the RxCLK signal 1222. Delay or alignment logic 1218 may adjust the timing of the set of difference signals 1202, 1204, 1206. For example, the delay or alignment logic 1218 may be used to adjust the timing of the difference signals 1202, 1204, 1206 with respect to the pulses on the RxCLK signal 1222 to ensure that the flip-flops 1220 capture the signaling state of the difference signals 1202, 1204, 1206 when the difference signals 1202, 1204, 1206 are stable. The delay or alignment logic 1218 may delay edges in the difference signals 1202, 1204, 1206 based on the delay configured for the programmable delay element 1214.

The programmable delay element 1214 may be configured in the CDR circuit 1200 to accommodate possible large variations in transition times in the difference signals 1202, 1204, 1206. In one example, the programmable delay element 1214 may introduce a minimum delay period that exceeds the duration of the timing skew between the occurrence of the first and last transitions on the difference signals 1202, 1204, 1206. For reliable operation of the CDR circuit 1200, the maximum delay time provided by the programmable delay element 1214 may not be greater than the symbol interval. At faster data rates, timing skew increases as a proportion of the symbol interval 1102, and the eye opening 1106 can become small in comparison to the symbol interval 1102. The maximum symbol transmission rate may be limited when the timing skew reduces the percentage of the symbol interval 1102 occupied by the eye opening 1106 below a threshold size that can support reliable capture of symbols.

Figure 13:
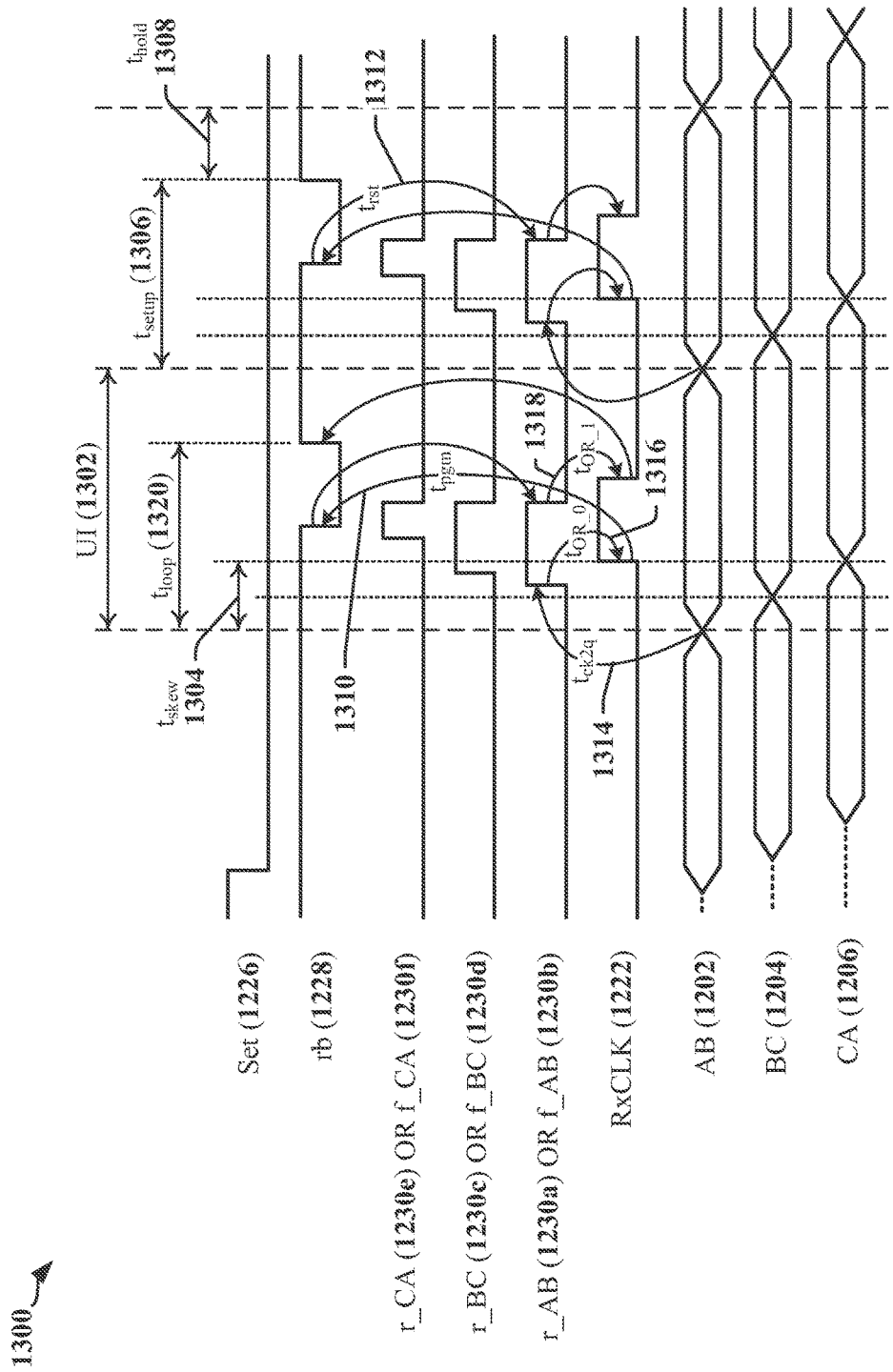
FIG. 13 illustrates timing associated with the CDR circuit of FIG. 12.

FIG. 13 is a timing diagram that illustrates certain aspects of the operation of the CDR circuit 1200. The diagram relates to operations after the programmable delay element 1214 has been configured, and the Set signal 1226 is inactive. The CDR circuit 1200 operates as an edge detector. C-PHY 3-phase encoding provides a single signaling state transition per unit interval (UI) 1302. Differences in the state of each wire of the trio, and/or transmission characteristics of the trio may cause a transition to appear at different times on two or more wires. The maximum difference in time of occurrence of transitions in the difference signals 1202, 1204, 1206 may be referred to as the skew time ($t_{skew}$) 1304. Other delays associated with the CDR circuit 1200 include the propagation delay ($t_{ck2q}$) 1314 through the pairs of D flip-flops 1210a, 1210b, 1210c, the propagation delay ($t_{OR\_0}$) 1316 associated with a rising edge passed through the OR gate 1212, the propagation delay ($t_{OR\_1}$) 1318 associated with a falling edge passed through the OR gate 1212, the programmable delay ($t_{pgm}$) 1310 combining the delay introduced by the programmable delay element 1214 and driver/inverter 1216, and the reset delay ($t_{rst}$) 1312 corresponding to the delay between time of receipt of the rb signal 1228 by the pairs of D flip-flops 1210a, 1210b, 1210c and time at which the flip-flop outputs are cleared.

A loop time ($t_{loop}$) 1320 may be defined as:

$$t_{loop} = t_{ck2q} + t_{OR\_1} + t_{pgm} + t_{rst} + t_{OR\_0} + t_{pgm}.$$

The relationship between $t_{loop}$ 1320 and the UI 1302 may determine the reliability of operation of the CDR circuit 1200. This relationship is affected by clock frequency used for transmission, which has a direct effect on the UI 1302, and variability in the operation of the programmable delay element 1214.

In some devices, the operation of the programmable delay element 1214 can be afflicted by variations in manufacturing process, circuit supply voltage, and die temperature (PVT) conditions. The delay time provided by the programmable delay element 1214 for a configured value may vary significantly from device to device, and/or from circuit to circuit within a device. In conventional systems, the nominal operating condition of the CDR circuit 1200 is generally set by design to generate a clock edge somewhere in the middle of the eye opening 1106 under all PVT conditions, in order to ensure that a clock edge occurs after the end 1112 of the signal transition region 1104 and prior to the commencement of the transition region to the next symbol, even under worst case PVT effects. Difficulty can arise in designing a CDR circuit 1200 that guarantees a clock edge within the eye opening 1106 when the transmission frequency increases and timing skew of the difference signals 1202, 1204, 1206 is large compared to the UI 1302. For example, a typical delay element may produce a delay value that changes by a factor of 2 over all PVT conditions.

Figure 14:
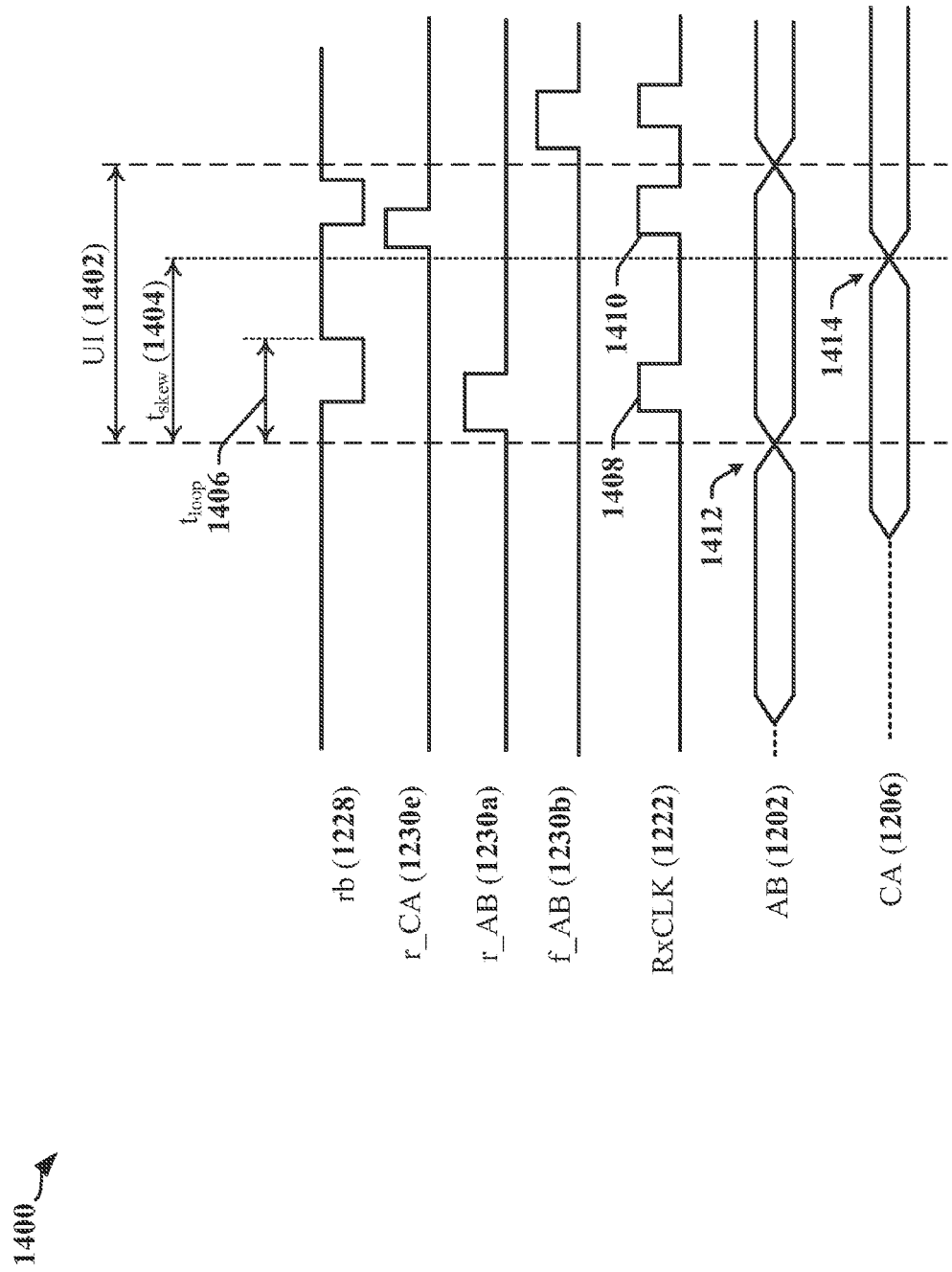
FIG. 14 illustrates timing associated with a CDR circuit that has a loop time that is shorter than the skew between signals transmitted on the C-PHY 3-Phase signal.

FIG. 14 is a timing diagram 1400 that illustrates the effect of a programmable delay element 1214 that provides an insufficient delay. In this example, $t_{loop}$ 1406 is too short for the observed $t_{skew}$ 1404, and multiple clock pulses 1408, 1410 are generated in one UI 1402. That is, the loop delay $t_{loop}$ 1406 is not big enough relative to $t_{skew}$ 1404, and later occurring transitions on the difference signals 1202, 1204, 1206 are not masked. In the depicted example, a second transition 1414 in one of the difference signals 1206 may be detected after a pulse 1408 has been generated in response to a first occurring transition 1412 in another of the difference signals 1202. In this example, the recovered clock frequency may be twice the clock frequency used to transmit symbols on the 3-phase interface.

Figure 15:
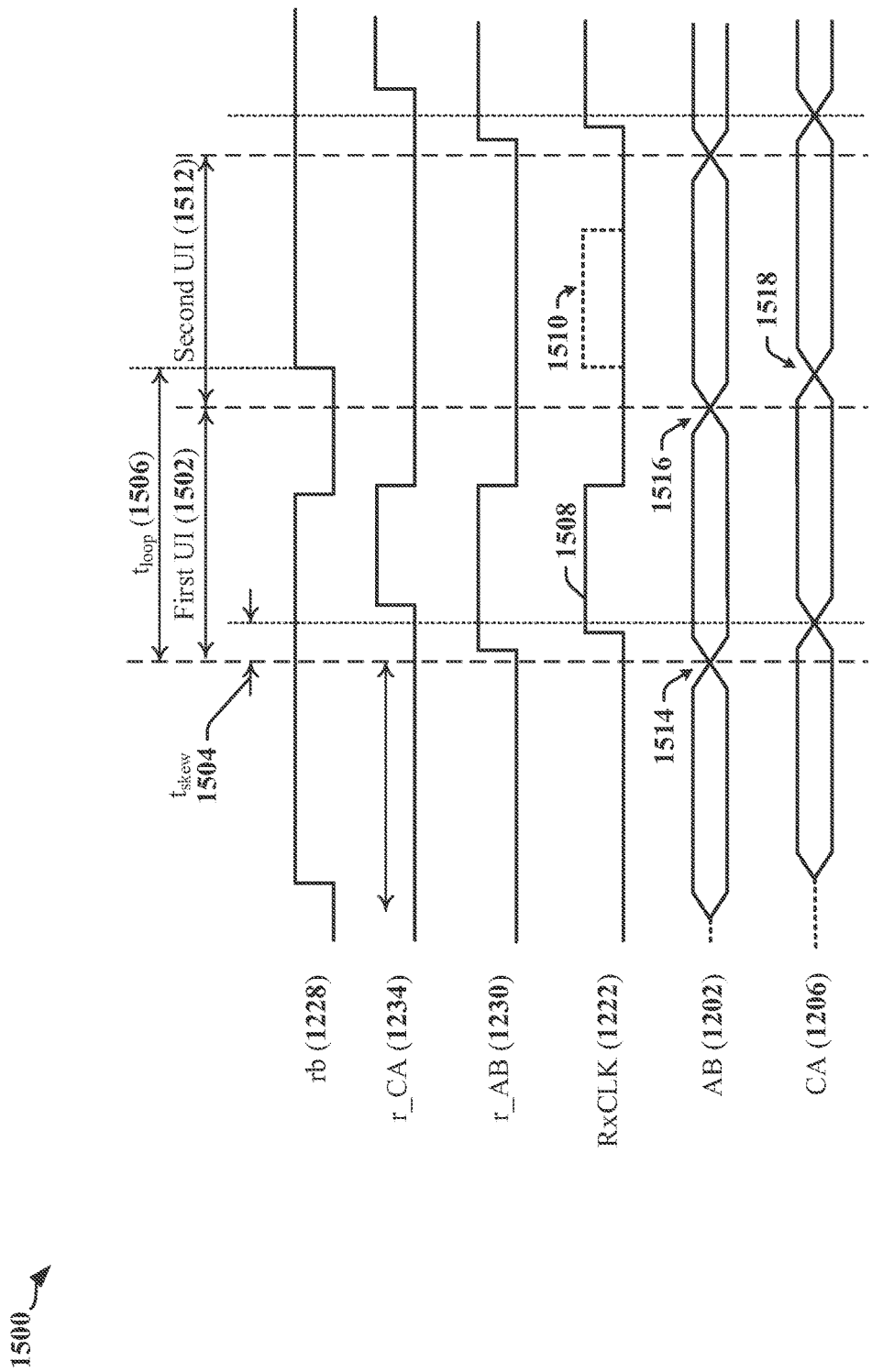
FIG. 15 illustrates timing associated with a CDR circuit that has a loop time that is longer than a symbol interval of the C-PHY 3-Phase signal.

FIG. 15 is a timing diagram 1500 that illustrates the effect of a programmable delay element 1214 that provides a delay that is too long. In this example, $t_{loop}$ 1506 is greater than the UI 1502. The CDR circuit 1200 may generate a clock pulse 1508 in response to a first-occurring transition 1514 in a first UI 1502, but the rb signal 1228 may be active when transitions 1516, 1518 occur in a second UI 1512, In the example depicted, the transitions 1516, 1518 in the second UI 1512 are masked, and the expected pulse 1510 corresponding to the second UI 1512 is suppressed. In this example, the recovered clock frequency may be half the clock frequency used to transmit symbols on the 3-phase interface.

As illustrated by the examples of FIGS. 14 and 15, the CDR circuit 1200 may be subject to the constraint:

$$t_{skew}<t_{loop}<UI.$$

Empirical evidence suggests that $t_{loop}$ 1320, 1406, 1506 is very sensitive to PVT. In some instances, the delay provided by the programmable delay element 1214 may be increased to accommodate the range of potential variations of PVT. As data rates increase, decreases and $t_{skew}$ increases proportionately with respect to the UI, reducing the potential range of delays available to configure the programmable delay element 1214.

Improved Clock Generation for C-PHY 3-Phase Interfaces

According to certain aspects disclosed herein, a clock recovery circuit used in a C-PHY multi-phase receiver can avoid issues associated with variations in PVT. A clock recovery circuit may be adapted to detect transitions in some UIs, and to suppress detection of transitions in other UIs. The clock recovery circuit may generate interpolated pulses for UIs in which transition detection is suppressed. In a first mode of operation, a programmed delay may be configured to cause a CDR circuit to suppress detection of transitions in a second-occurring UI after detecting a transition in first-occurring UI. In this first mode of operation, the CDR circuit generates a clock signal with a frequency that is half the frequency of the symbol transmission frequency. In a second mode of operation, the programmed delay may be configured to cause the CDR circuit to suppress detection of transitions in two succeeding UIs after detecting a transition in first-occurring UI. In the second mode of operation, the CDR circuit generates a clock signal with a frequency that is one-third of the frequency of the symbol transmission frequency. Other modes of operation may produce frequencies that are a quarter or less of the symbol frequency, etc. A delay-locked loop (DLL) may be used to generate clock pulses corresponding to UIs in which transition detection is suppressed. The clock pulses generated by the DLL may be inserted between pulses of the clock signal produced by the CDR circuit.

Figure 16:
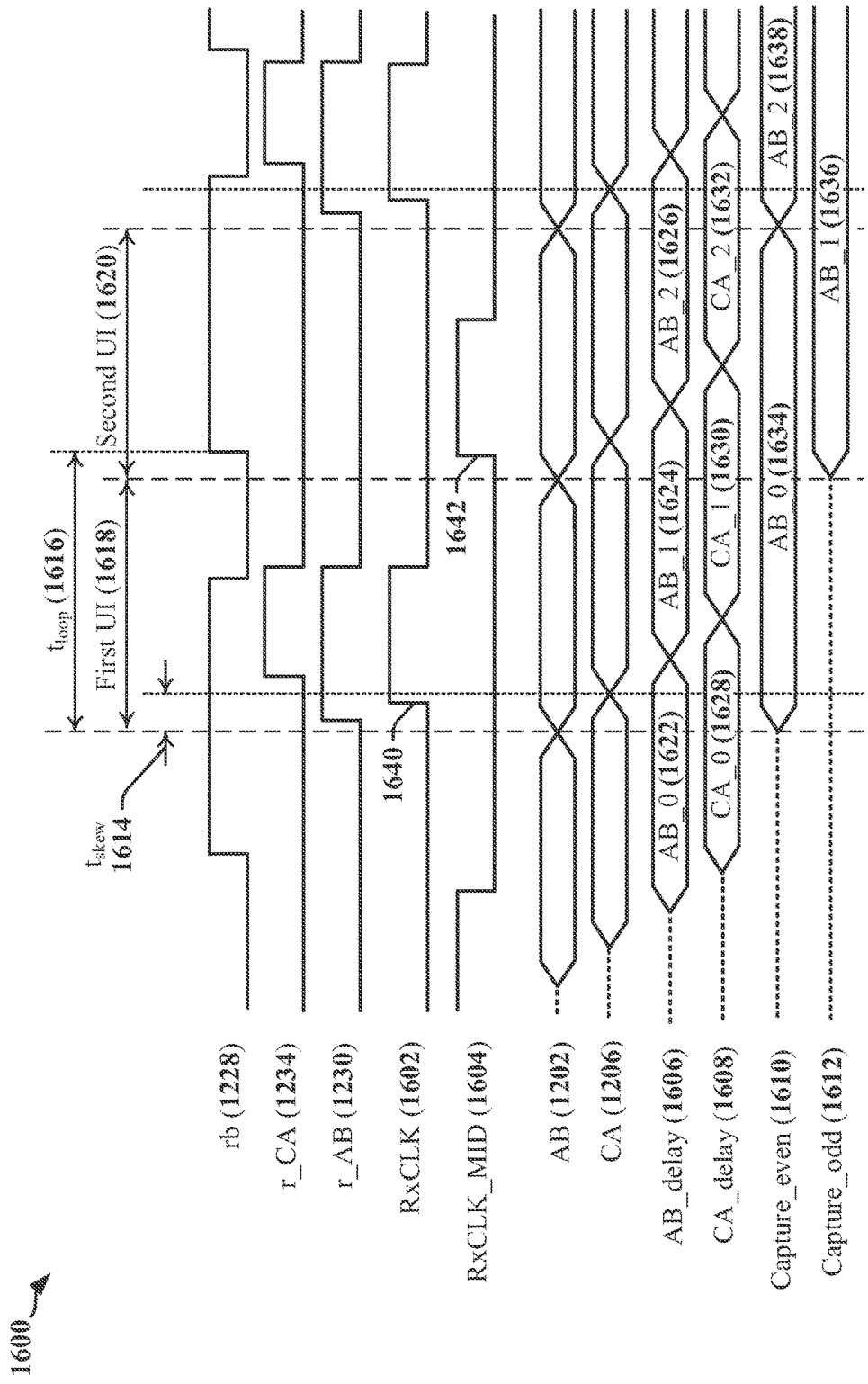
FIG. 16 is a timing diagram that illustrates the operation of a CDR adapted in accordance with certain aspects disclosed herein.

FIG. 16 is a timing diagram 1600 that illustrates clock generation in accordance with certain aspects disclosed herein. One or more programmable delay elements in a clock recovery circuit may be adapted, and/or configured with delays such that edge detection and pulse generation is suppressed in a proportion of UIs 1618, 1620. In the illustrated example, a pulse generating circuit or loop provides a clock pulse in an RxCLK signal 1602 for a first UI 1618, but does not detect the transitions in a second, succeeding UI 1620. The clock recovery circuit may include or cooperate with a DLL circuit that supplies a pulse 1642 corresponding to the second UI 1620 in an intermediate clock signal (RxCLK_MID) 1604. The pulse-generating circuit or loop may be configured to miss or ignore transitions in two or more UIs 1620 after generating the pulse 1640 in the first UI 1618, with one or more DLL circuits supplying pulses for the UIs 1620 during which pulse generation is suppressed when, for example, transitions are ignored. The pulses generated by the one or more DLLs may be positioned between, and with respect to rising edges of the RxCLK signal 1602. FIG. 16 illustrates a half-rate example in which the RxCLK_MID signal 1604 is generated with a 180-degree phase shift with respect to the RxCLK signal 1602.

The RxCLK signal 1602 and the RXCLK_MID signal 1604 may be used to sample delayed versions of the difference signals 1202, 1204, 1206, including for example the AB_delay signal 1606, which is a delayed version of the AB signal 1202, and the CA_delay signal 1608, which is a delayed version of the CA signal 1206. The RxCLK signal 1602 captures even-occurring symbols 1622/1628, 1626/1632 to provide symbols 1634 and 1638 in the Capture_even signal 1610, while the RXCLK_MID signal 1604 captures odd-occurring symbols 1624/1630 to provide symbols 1636 in the Capture_odd signal 1612.

In some instances, the Capture_even signal 1610 and the Capture_odd signal 1612 can be re-aligned to the RxCLK signal 1602, for example, such that two or more of the symbols 1634, 1636, 1638, can be read in parallel.

Figure 17:
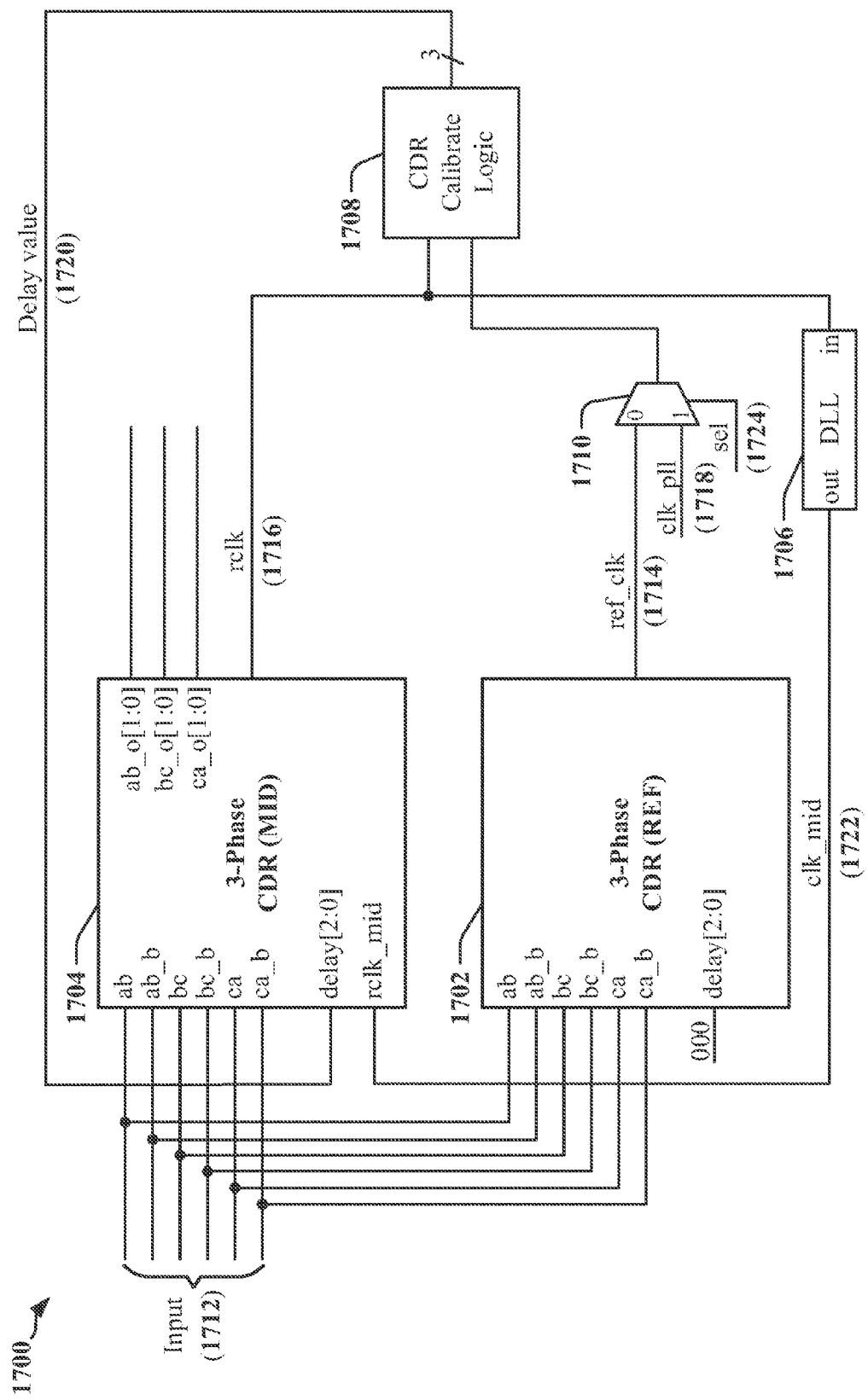
FIG. 17 illustrates an example of a clock generation circuit according to certain aspects disclosed herein.

FIG. 17 illustrates a circuit 1700 that can be used in accordance with the timing of FIG. 16 to reliably capture symbols transmitted on a 3-phase interface when the timing constraint $t_{skew}<t_{loop}<UI$ indicates that the reliability of clock recovery would otherwise be jeopardized. The circuit 1700 includes two CDR circuits 1702, 1704 and a DLL circuit 1706 that cooperate to produce a first clock signal (ref_clk signal 1714) and a second clock signal (rclk signal 1716) that can be used to capture symbols from an input 1712 that may include the difference signals 1202, 1204, 1206 and inverted versions of the difference signals 1202, 1204, 1206. The ref_clk signal 1714 is generated using a first 3-phase CDR circuit 1702. The ref_clk signal 1714 may be provided as a reference clock having a frequency of $F_{ref}$ corresponding to the symbol transmission frequency of the 3-phase interface. The rclk signal 1716 is generated using a second CDR circuit 1704. In various modes of operation, the frequency of the rclk signal 1716 may be a multiple of the frequency of the ref_clk signal 1714 (i.e. $2F_{ref}$, $1F_{ref}$, $0.5F_{ref}$, $\frac{1}{3}F_{ref}$, $0.25F_{ref}$, etc.). The first CDR circuit 1702 and the second CDR circuit 1704 may have similar architectures.

CDR calibration logic 1708 may be provided to detect differences in the frequency of the rclk signal 1716 relative to the frequency of the ref_clk signal 1714. One or more programmable delay elements in the second CDR circuit 1704 may be calibrated based on the difference in frequencies of the rclk signal 1716 and the ref_clk signal 1714. In one example, the CDR calibration logic 1708 may provide a multi-bit control signal. The multi-bit control signal may define that defines a delay parameter 1720 that controls the duration of delays produced by the programmable delay element in the second CDR circuit 1704. The programmable delay element may be configured using a parameter that is selected to cause the second CDR circuit 1704 to suppress pulse generation in some proportion of the UIs 1618, 1620. The rclk signal 1716 is provided to the DLL circuit 1706, which produces additional pulses in the form of a phase-shifted signal 1722 that, when combined with pulses in the rclk signal 1716, can be used by the second CDR circuit 1704 to generate the parallel output data (ab_o[1:0], bc_o [1:0], ca_o[1:0].

The programmed delay in the second CDR circuit 1704 may be configured by adjusting the programmed delay while monitoring the frequency of the rclk signal 1716. Initially, the programmed delay may set to produce a delay that persists for a time that is less than the UI time (the time required to transmit one symbol). In one example, the clock recovery circuit may be configured to produce the rclk signal 1716 with a frequency equal to the symbol transmission frequency when a 3-phase signal is initially received. The value of the programmed delay may then be incrementally increased until the frequency of the rclk signal 1716 is divided by 2, by 3, or by any desired factor.

Figure 18:
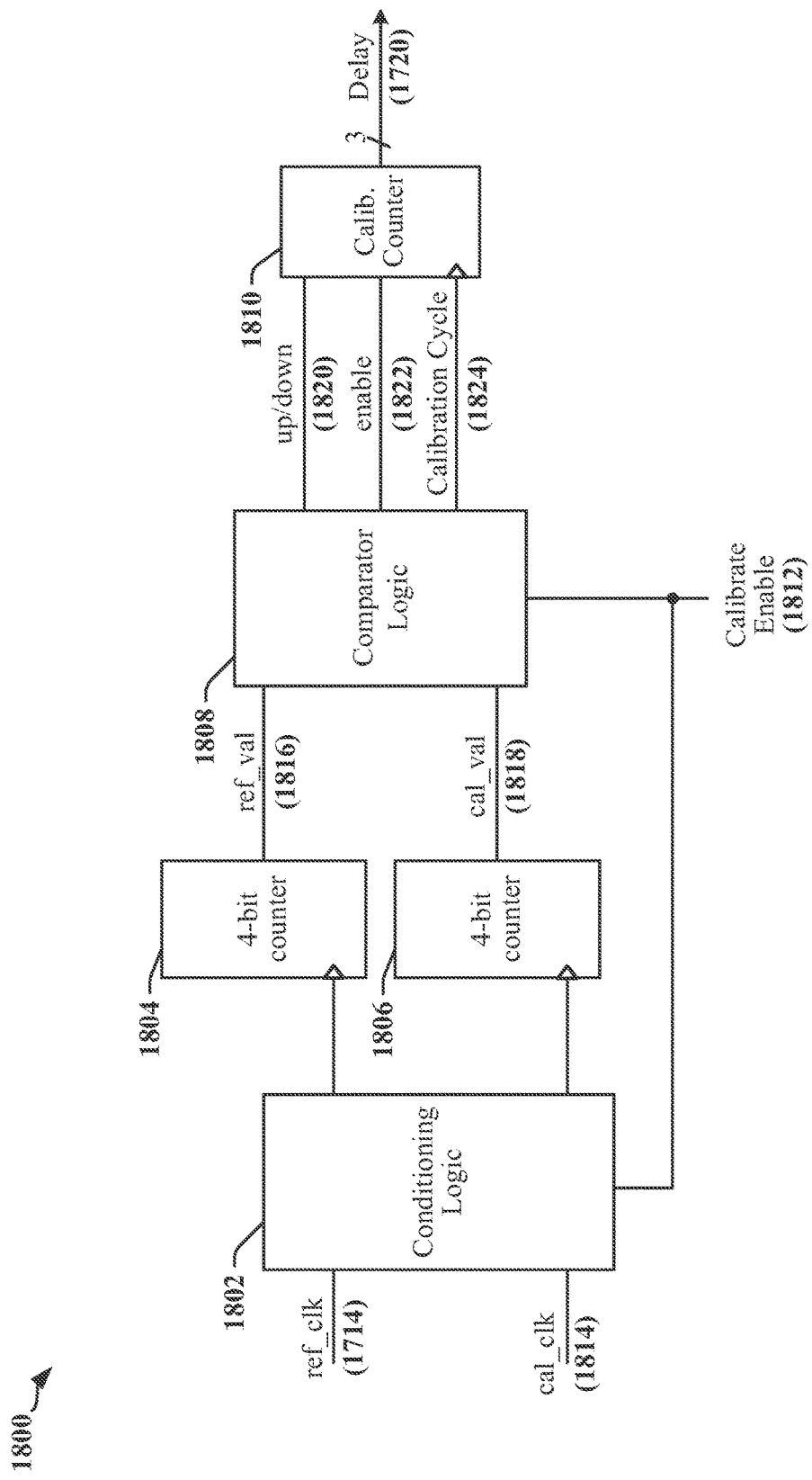
FIG. 18 illustrates one example of a circuit that may be used to calibrate a clock generation circuit provided in accordance with certain aspects disclosed herein.

FIG. 18 illustrates an example of a CDR calibration circuit 1800 used to configure the delay element of the second CDR circuit 1704. The CDR calibration circuit 1800 may be enabled by a signal 1812, which may be provided by a processing circuit. The CDR calibration circuit 1800 may include conditioning logic 1802 that is used to drive, and/or adjust timing of the ref_clk signal 1714 and a calibration clock (cal_clk) signal 1816. In one example, the ref_clk signal 1714 may be derived from a reference CDR circuit (e.g., the CDR circuit 1702), a free-running oscillator, a phase-locked loop, or other clock generation circuit. The CDR calibration circuit 1800 may include counters 1804 and 1806 that are clocked by conditioned versions of the ref_clk signal 1714 and the cal_clk signal 1816. The output of the counters 1804 and 1806 may be monitored by comparator logic 1808, which may determine the frequency of the ref_clk signal 1714 relative to the cal_clk signal 1816. A calibration counter 1810 may be adjusted during successive calibration cycles to control one or more programmable delay elements in a CDR circuit (e.g. the second CDR circuit 1704). The calibration counter 1810 may, for example, be incremented or decremented after each calibration cycle depending on a determination made by the comparator logic 1808. The comparator logic 1808 may control the calibration counter 1810 using one or more of an up/down signal 1818, an enable counter signal 1820, and a calibration cycle clock signal 1822.

Clock frequencies may be measured using the counters 1804, 1806. The counters 1804, 1806 may be incremented by the ref_clk signal 1714 and the cal_clk signal 1816 for a predetermined time period, which may be determined by the calibration cycle clock signal 1824 for example. A first counter 1804 may capture the number of clock cycles (ref_val 1816) corresponding to the ref_clk signal 1714. In some instances, the first counter may be operated immediately after initialization to capture a ref_val 1816 that is a measure of the full-rate symbol transmission clock, and in some instances, this initially-obtained ref_val 1816 may be registered or otherwise captured to be used for subsequent calibration cycles. A second counter 1804 counts the number of clock cycles (cal_val 1818) that occur during a calibration cycle. The calibration cycle may be configured as a predetermined time period or may be an adjustable time period. For each calibration cycle, a delay parameter 1720 is provided to the CDR circuit 1704 under calibration, and the frequency of the resultant cal_clk signal 1814 may be measured as the cal_val 1818 accumulated by the second counter 1806 during the calibration cycle. When the cal_val 1818 reflects a value that is a division of the clock frequency by the desired factor, the configuration is complete and the final value of the delay parameter 1720 may be used to operate the clock recovery circuit.

The second CDR circuit 1704 may be calibrated by incrementing or decrementing the delay parameter 1720 until a desired frequency for the cal_clk signal 1814. Changes in frequency may result in changes in cal_val 1818 and the comparator logic 1808 may continue calibration until a predefined difference between cal_val 1818 and ref_val 1816 is obtained. Calibration may commence with a low value for the delay parameter 1720 and the delay parameter 1720 may then be incremented for each calibration cycle. Calibration may commence with a high value for the delay parameter 1720 and the delay parameter 1720 may then be decremented for each calibration cycle.

According to certain aspects, a receiver may determine the nominal symbol transmission frequency of the C-PHY interface by adjusting delay elements of a CDR circuit until a training pattern is accurately received. A transmitter may send the training pattern during link initialization, prior to transmitting individual packets of data, after detection of an error at the receiver, and/or under application or system control. The receiver may monitor the C-PHY interface for activity, and may perform calibration upon detection of transitions. In some instances, the receiver may determine that the CDR circuit has already been calibrated and may perform calibration if the training pattern is not properly received.

In the example illustrated in FIG. 12, calibration commences when the programmable delay element 1214 is initialized to a predetermined value that enables the CDR circuit 1200 to detect the training pattern. The CDR circuit 1200 may be adapted according to certain aspects disclosed herein such that the programmable delay element 1214 may be adjusted to increase the $t_{loop}$ duration 1616 until errors are detected in the training pattern. The CDR circuit 1200 may be configured for normal operation with a programmable delay element 1214 configured with a value that is one or more increments lower than the value that caused errors to be detected in the training pattern.

Efficient Training Patterns for C-PHY Interfaces

Certain aspects disclosed herein provide a signal that includes a training pattern that supports calibration of multiphase CDR circuits in a C-PHY interface. The training pattern may enable receivers to determine certain operating characteristics of the C-PHY interface, including minimum UI times, sampling window, maximum encoding jitter, and worst-case ISI for a C-PHY interface. The training pattern may be used for configuring or adjusting adaptive equalization parameters and/or parameters for adaptive data edge tracking for clock data recovery. For example, the training pattern may be used to program a delay element in a CDR or data sampling circuit.

Figure 19:
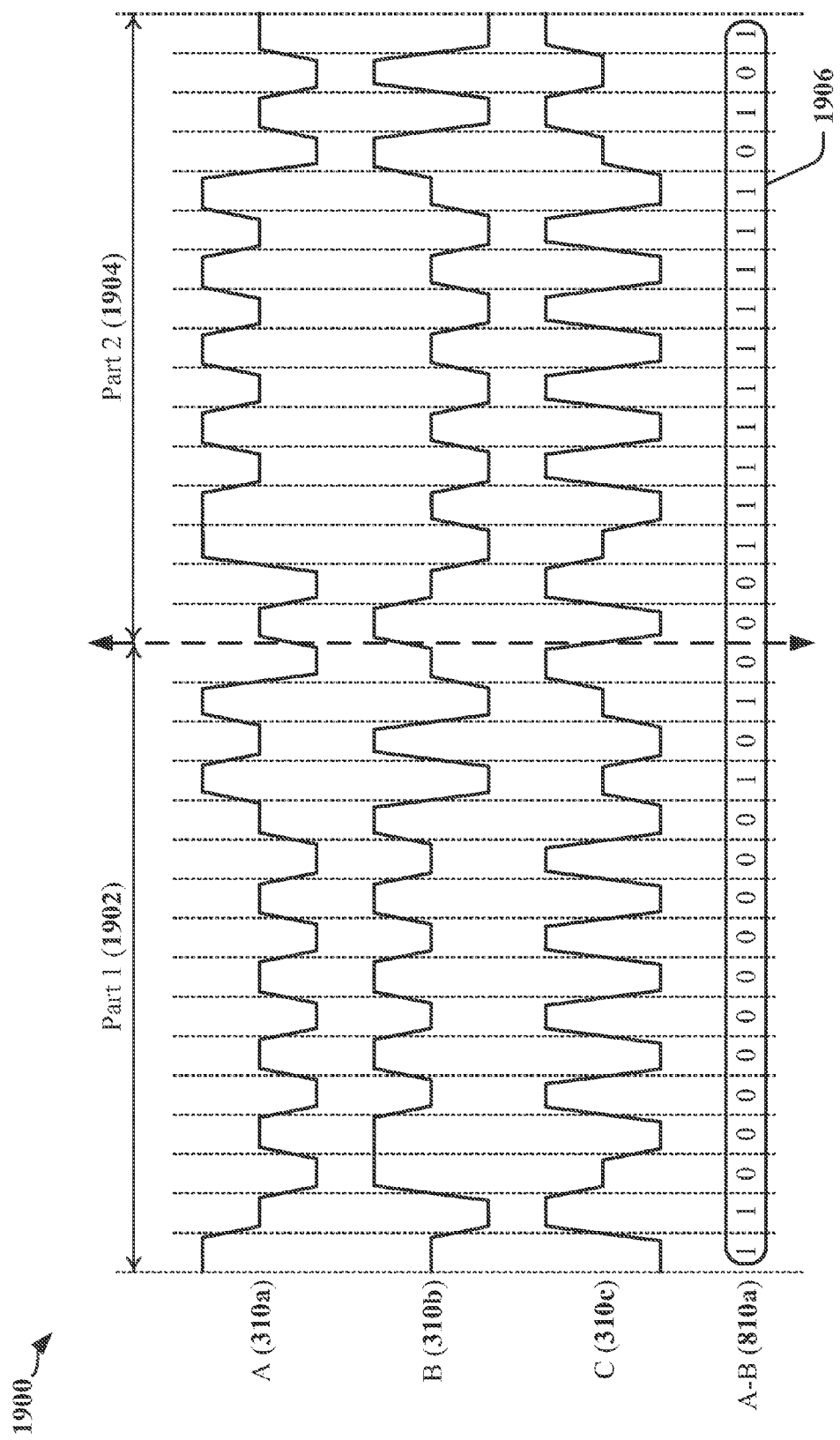
FIG. 19 illustrates a training pattern configured according to certain aspects disclosed herein.

FIG. 19 illustrates a training pattern 1900 that may be transmitted on a C-PHY interface. The pattern is created by transmitting a 3-phase signal on each of the wires 310a, 310b and 310c of a 3-wire bus, where the 3-phase signals are out-of-phase with one another. With reference also to FIG. 8, a receiving device includes a set of differential receivers 802a, 802b and 802c configured to generate difference signals 810a, 810b, 810c by comparing the signaling state of each pair of the three signal wires 310a, 310b and 310c (which may be referred to as the A, B, and C wires) in a trio. FIG. 19 illustrates the A-B difference signal 810a output by the A-B differential receiver 802a that compares the signaling state of the A and B signal wires 310a, 310b. The transition detection circuit 804 and/or the clock generation circuit 806 can be calibrated while the training pattern 1900 is present on the three signal wires 310a, 310b and 310c. When the receiver is calibrated, the A-B difference signal 810a is expected to output the bit sequence 1906 illustrated in FIG. 19.

The training pattern 1900 causes the A-B differential receiver 802a to output a bit sequence 1906 that includes 10 consecutive '1's and 10 consecutive '0's, representing the low frequency component of the training pattern 1900. The training pattern 1900 also causes the A-B differential receiver 802a to output a bit sequence 1906 that includes '1010' sequences of bits representing the high frequency component of the training pattern 1900. This combination of high frequency and low-frequency components can generate worst-case encoding jitter.

In a C-PHY interface, possible signaling states may be defined as {-1, 0, +1}, and 6 possible transitions in signaling states may occur on the trio. The possible transitions in signaling states include {-1 to 0, -1 to +1, 0 to +1, 0 to -1, +1 to 0, +1 to -1}. Encoding jitter may occur when two different types of transition occur at a boundary between consecutively transmitted symbols. For each symbol boundary, the training pattern 1900 causes at least two types of transition in signaling state, and the receiver can be calibrated to operate in the presence of encoding jitter based on these transitions.

The illustrated training pattern 1900 is a 32-bit transmission that has two parts 1902, 1904. The two parts 1902, 1904 are complimentary. The first part 1902 produces the binary bit pattern '11000000000001010' (0xC00A or C00A$_{16}$), and the second part 1904 produces the binary bit pattern '00111111111110101' (0x3FF5 or 3FF5$_{16}$). A receiver may be configured with knowledge of a number of training patterns. Each training pattern may be in the order of 32 bits, permitting the receiver to determine configuration parameters in a relatively short calibration period provided during link startup communications, for example.

In operation, the training pattern 1900 may be transmitted according to design, configuration, or in accordance with events defined by protocol. In one example, the training pattern 1900 may be transmitted when the C-PHY interface initialized, after power-on, wake from low-power mode or after system reset. In another example, the training pattern 1900 may be transmitted between each transaction or frame transmitted on the C-PHY interface. In another example, the training pattern 1900 may be transmitted after a certain number of transmission or decoding errors have been detected, when an error rate exceeds a preconfigured threshold or when a number of retransmissions is required. In some instances, the training pattern 1900 may be repeated during link training or calibration. A number of repetitions of the training pattern 1900 may be configured for different types of link training or calibration. For example, link training or calibration that follows a system initialization may involve a greater number of repetitions than the number of repetitions transmitted between frames.

A transmitter may use the training pattern 1900 to calibrate pre-emphasis or link-related timing circuits. The transmitter may monitor signaling state of the wires of the C-PHY interface during transmission of the training pattern 1900. The transmitter may thereby determine operating characteristics of the C-PHY interface, including minimum UI times, sampling window, maximum encoding jitter, and worst-case ISI for a C-PHY interface. These operating characteristics may be used to configure timing circuits in the transmitter.

The training pattern 1900 can mimic much longer PRBS patterns, while generating similar encoding jitter and minimum UI during training. Alternative training patterns using PRBS can require between 3,584 and 14,336 bits to test all possible PRBS conditions during link training. Calibration using such alternative training patterns is very time consuming, and typically not applicable or conducive to fast data communication channels.

The training pattern 1900 enables adaptive equalization circuits in a C-PHY interface to find minimum UI during calibration. Equalization strength may be increased or decreased as needed to obtain an improved minimum UI that is close to the ideal UI.

The training pattern 1900 enables calibration of adaptive edge tracking circuits in a C-PHY interface that employ a half-rate design. A half-rate CDR can be calibrated by using the minimum UI to set an appropriate delay value used to set the delayed half-rate clock sampling position.

The training pattern 1900 enables calibration of CDRs used in a C-PHY interface. Delay elements in a CDR may be calibrated using minimum UI and maximum encoding jitter values to optimize the CDR delay values (and to generate the half-rate clock).

The training pattern 1900 enables rapid acquisition of minimum UI and maximum encoding jitter information. The use of the training pattern 1900 can ensure fast communications by minimizing link training time. Link training time can become a critical issue when fast communication of sensor and camera information is needed for example.

According to certain aspects, the training pattern 1900 may be generated in the physical layer (PHY) of a C-PHY interface. In one example, the training pattern 1900 may be may be generated using a sequence of data used to directly control line drivers 308 (see FIG. 3) in a C-PHY transmitter. In another example, the training pattern 1900 may be generated using a stored sequence of symbols that is provided to a state encoder 306 (see FIG. 3) in a C-PHY transmitter. In another example, the training pattern 1900 may be generated using a stored sequence of data words that is provided to a mapper 302 (see FIG. 3) in a C-PHY transmitter.

According to certain aspects, the training pattern 1900 may be generated by protocol in an application processor or other component of a device that includes a C-PHY interface. In one example, the training pattern 1900 may be generated from a data packet provided to the PHY.

Examples of Processing Circuits and Methods

Figure 20:
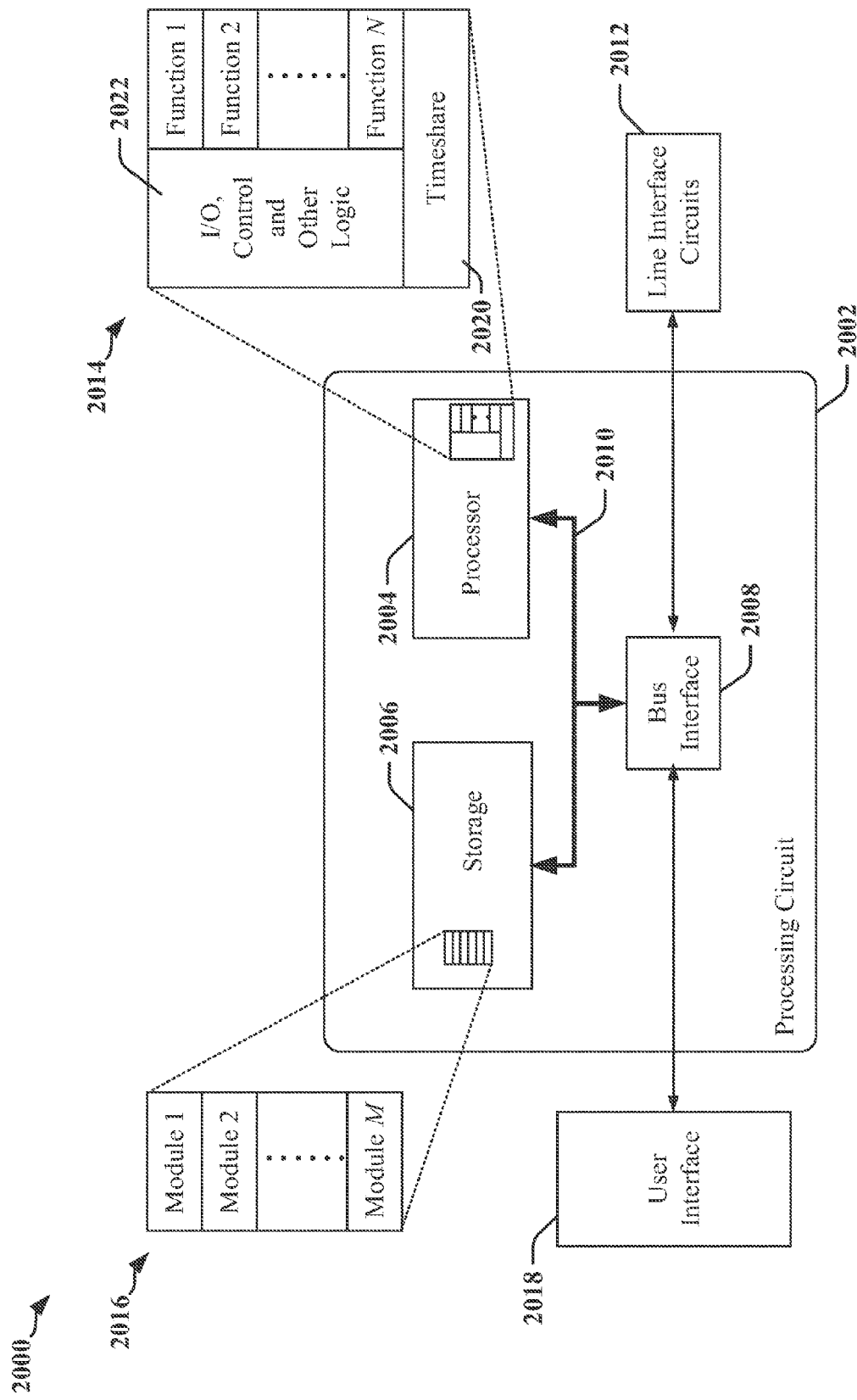
FIG. 20 is a block diagram illustrating an example of an apparatus employing a processing circuit that may be adapted according to certain aspects disclosed herein.

FIG. 20 is a conceptual diagram 2000 illustrating an example of a hardware implementation for an apparatus employing a processing circuit 2002 that may be configured to perform one or more functions disclosed herein. In accordance with various aspects of the disclosure, an element, or any portion of an element, or any combination of elements as disclosed herein may be implemented using the processing circuit 2002. The processing circuit 2002 may include one or more processors 2004 that are controlled by some combination of hardware and software modules. Examples of processors 2004 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 2004 may include specialized processors that perform specific functions, and that may be configured, augmented or controlled by one of the software modules 2016. The one or more processors 2004 may be configured through a combination of software modules 2016 loaded during initialization, and further configured by loading or unloading one or more software modules 2016 during operation.

In the illustrated example, the processing circuit 2002 may be implemented with a bus architecture, represented generally by the bus 2010. The bus 2010 may include any number of interconnecting buses and bridges depending on the specific application of the processing circuit 2002 and the overall design constraints. The bus 2010 links together various circuits including the one or more processors 2004, and storage 2006. Storage 2006 may include memory devices and mass storage devices, and may be referred to herein as computer-readable media and/or processor-readable media. The bus 2010 may also link various other circuits such as timing sources, timers, peripherals, voltage regulators, and power management circuits. A bus interface 2008 may provide an interface between the bus 2010 and one or more transceivers 2012. A transceiver 2012 may be provided for each networking technology supported by the processing circuit. In some instances, multiple networking technologies may share some or all of the circuitry or processing modules found in a transceiver 2012. Each transceiver 2012 provides a means for communicating with various other apparatus over a transmission medium. Depending upon the nature of the apparatus, a user interface 2018 (e.g., keypad, display, speaker, microphone, joystick) may also be provided, and may be communicatively coupled to the bus 2010 directly or through the bus interface 2008.

A processor 2004 may be responsible for managing the bus 2010 and for general processing that may include the execution of software stored in a computer-readable medium that may include the storage 2006. In this respect, the processing circuit 2002, including the processor 2004, may be used to implement any of the methods, functions and techniques disclosed herein. The storage 2006 may be used for storing data that is manipulated by the processor 2004 when executing software, and the software may be configured to implement any one of the methods disclosed herein.

One or more processors 2004 in the processing circuit 2002 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 2006 or in an external computer readable medium. The external computer-readable medium and/or storage 2006 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a ROM, a PROM, an erasable PROM (EPROM), an EEPROM, a register, a removable disk, and any other suitable medium for storing software and/or instructions that may be accessed and read by a computer. The computer-readable medium and/or storage 2006 may also include, by way of example, a carrier wave, a transmission line, and any other suitable medium for transmitting software and/or instructions that may be accessed and read by a computer. Computer-readable medium and/or the storage 2006 may reside in the processing circuit 2002, in the processor 2004, external to the processing circuit 2002, or be distributed across multiple entities including the processing circuit 2002. The computer-readable medium and/or storage 2006 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 2006 may maintain software maintained and/or organized in loadable code segments, modules, applications, programs, etc., which may be referred to herein as software modules 2016. Each of the software modules 2016 may include instructions and data that, when installed or loaded on the processing circuit 2002 and executed by the one or more processors 2004, contribute to a run-time image 2014 that controls the operation of the one or more processors 2004. When executed, certain instructions may cause the processing circuit 2002 to perform functions in accordance with certain methods, algorithms and processes described herein.

Some of the software modules 2016 may be loaded during initialization of the processing circuit 2002, and these software modules 2016 may configure the processing circuit 2002 to enable performance of the various functions disclosed herein. For example, some software modules 2016 may configure internal devices and/or logic circuits 2022 of the processor 2004, and may manage access to external devices such as the transceiver 2012, the bus interface 2008, the user interface 2018, timers, mathematical coprocessors, and so on. The software modules 2016 may include a control program and/or an operating system that interacts with interrupt handlers and device drivers, and that controls access to various resources provided by the processing circuit 2002. The resources may include memory, processing time, access to the transceiver 2012, the user interface 2018, and so on.

One or more processors 2004 of the processing circuit 2002 may be multifunctional, whereby some of the software modules 2016 are loaded and configured to perform different functions or different instances of the same function. The one or more processors 2004 may additionally be adapted to manage background tasks initiated in response to inputs from the user interface 2018, the transceiver 2012, and device drivers, for example. To support the performance of multiple functions, the one or more processors 2004 may be configured to provide a multitasking environment, whereby each of a plurality of functions is implemented as a set of tasks serviced by the one or more processors 2004 as needed or desired. In one example, the multitasking environment may be implemented using a timesharing program 2020 that passes control of a processor 2004 between different tasks, whereby each task returns control of the one or more processors 2004 to the timesharing program 2020 upon completion of any outstanding operations and/or in response to an input such as an interrupt. When a task has control of the one or more processors 2004, the processing circuit is effectively specialized for the purposes addressed by the function associated with the controlling task. The timesharing program 2020 may include an operating system, a main loop that transfers control on a round-robin basis, a function that allocates control of the one or more processors 2004 in accordance with a prioritization of the functions, and/or an interrupt driven main loop that responds to external events by providing control of the one or more processors 2004 to a handling function.

Figure 21:
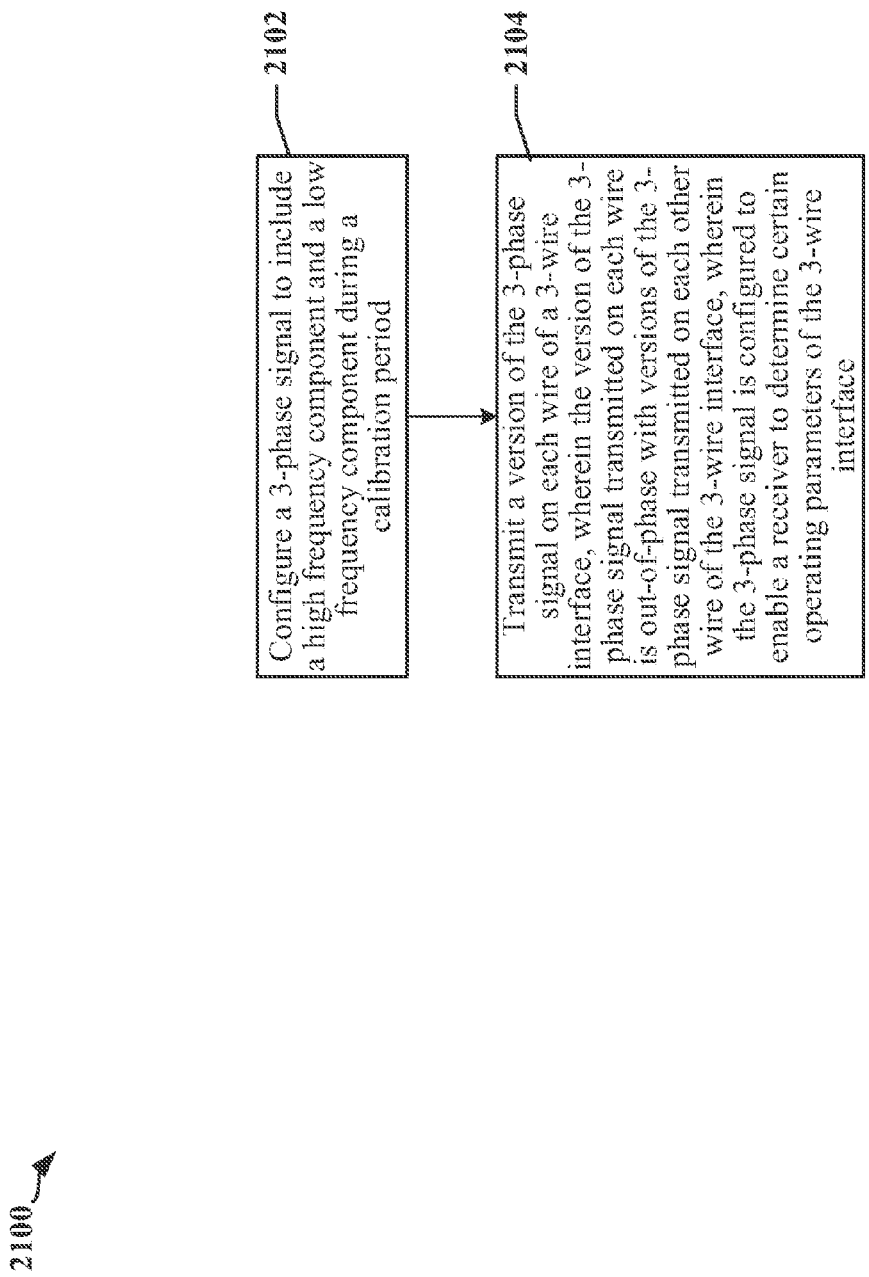
FIG. 21 is a flowchart of a first method of calibration according to certain aspects disclosed herein.

FIG. 21 is a flowchart 2100 of a method of calibration at a transmitting device that may be performed by a transmitting device coupled to a C-PHY 3-Phase interface.

At block 2102, the transmitting device may configure a 3-phase signal to include a high frequency component and a low frequency component during a calibration period.

At block 2104, the transmitting device may transmit a version of the 3-phase signal on each wire of a 3-wire interface. The version of the 3-phase signal transmitted on each wire may be out-of-phase with the versions of the 3-phase signal transmitted on each of the other wires of the 3-wire interface. The 3-phase signal may be configured to enable a receiver to determine certain operating parameters of the 3-wire interface.

In some examples, configuring the 3-phase signal includes transmitting a first sequence of symbols selected to cause a differential receiver to produce a constant output during a first portion of the calibration period. The differential receiver may be coupled to two wires of the 3-wire interface. Configuring the 3-phase signal may include transmitting a second sequence of symbols selected to cause the differential receiver to produce an output that changes for every symbol transmitted during a second portion of the calibration period.

In various examples, configuring the 3-phase signal includes transmitting two sequences of symbols that cause a differential receiver to produce output signals that are the inverse of one another. Each of the two sequences of symbols may alternate in transmission during the calibration period. In one example, each of the two sequences of symbols includes 16 symbols. The two sequences of symbols may be repeatedly and alternately transmitted during the calibration period.

In some examples, the calibration period occurs when the 3-wire interface is initialized. The calibration period may occur between transmissions of frames on the 3-wire interface.

In one example, the transmitting device may monitor the 3-wire interface while transmitting a version of the 3-phase signal on each wire of the 3-wire interface, and may calibrate one or more timing circuit based on characteristics of the 3-wire interface that are determined by monitoring the 3-wire interface.

Figure 22:
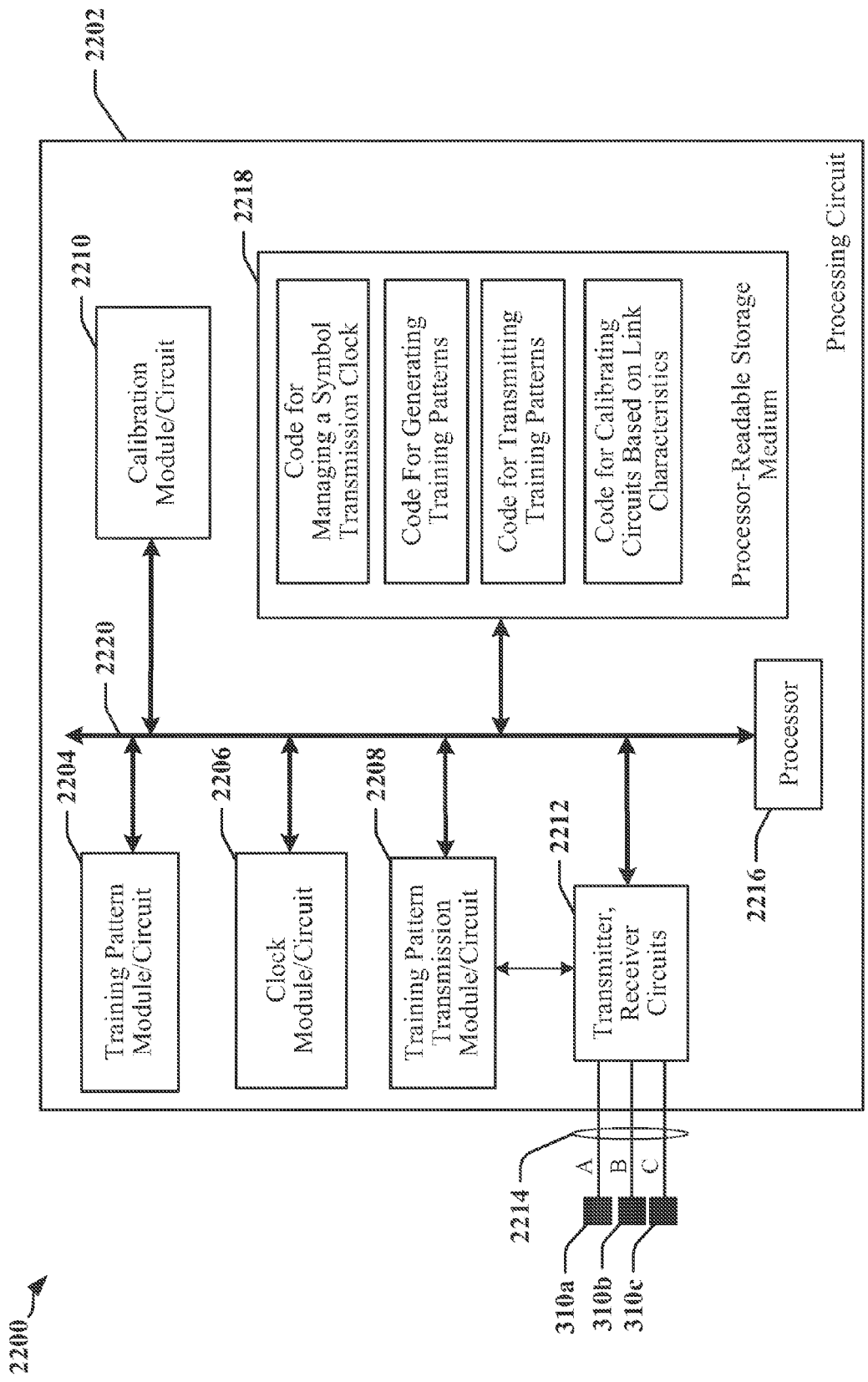
FIG. 22 is a diagram illustrating a first example of a hardware implementation for an apparatus employing a processing employing a processing circuit adapted according to certain aspects disclosed herein.

FIG. 22 is a diagram illustrating an example of a hardware implementation for an apparatus 2200 employing a processing circuit 2202. The processing circuit typically has a processor 2216 that may include one or more of a microprocessor, microcontroller, digital signal processor, a sequencer and a state machine. The processing circuit 2202 may be implemented with a bus architecture, represented generally by the bus 2220. The bus 2220 may include any number of interconnecting buses and bridges depending on the specific application of the processing circuit 2202 and the overall design constraints. The bus 2220 links together various circuits including one or more processors and/or hardware modules, represented by the processor 2216, the modules or circuits 2204, 2206, 2208 and 2210, difference receiver circuits 2212 that determine difference signaling state between different pairs of the connectors or wires 2214 and the computer-readable storage medium 2218. The bus 2220 may also link various other circuits such as timing sources, peripherals, voltage regulators, and power management circuits, which are well known in the art, and therefore, will not be described any further.

The processor 2216 is responsible for general processing, including the execution of software stored on the computer-readable storage medium 2218. The software, when executed by the processor 2216, causes the processing circuit 2202 to perform the various functions described supra for any particular apparatus. The computer-readable storage medium 2218 may also be used for storing data that is manipulated by the processor 2216 when executing software, including data decoded from symbols transmitted over the connectors or wires 2214, which may be configured as data lanes and clock lanes. The processing circuit 2202 further includes at least one of the modules 2204, 2206, 2208 and 2210. The modules 2204, 2206, 2208 and 2210 may be software modules running in the processor 2216, resident/stored in the computer-readable storage medium 2218, one or more hardware modules coupled to the processor 2216, or some combination thereof. The modules 2204, 2206, 2208 and/or 2210 may include microcontroller instructions, state machine configuration parameters, or some combination thereof.

In one configuration, the apparatus 2200 may be configured for data communication over a C-PHY 3-phase interface 2214. The apparatus 2200 may include modules and/or circuits 2204, 2206 that are adapted to configure a 3-phase signal to include a high frequency component and a low frequency component during a calibration period, and modules and/or circuits 2208, 2212 that are configured to transmit a version of the 3-phase signal on each wire of a 3-wire interface. The version of the 3-phase signal transmitted on each wire 310*a*, 310*b*, 310*c* is out-of-phase with versions of the 3-phase signal transmitted on each other wire of the 3-wire interface 2214. The 3-phase signal may be configured to enable a receiver to determine certain operating parameters of the 3-wire interface.

In some examples, the 3-phase signal is configured by transmitting a first sequence of symbols selected to cause a differential receiver to produce a constant output during a first portion of the calibration period. The differential receiver may be coupled to two wires 310*a*, 310*b*, and/or 310*c* of the 3-wire interface 2214. Configuring the 3-phase signal may include transmitting a second sequence of symbols selected to cause the differential receiver to produce an output that changes for every symbol transmitted during a second portion of the calibration period. Configuring the 3-phase signal may include transmitting two sequences of symbols that cause a differential receiver to produce output signals that are the inverse of one another. Each of the two sequences of symbols alternate in transmission during the calibration period. In one example, each of the two sequences of symbols includes 16 symbols. The two sequences of symbols may be repeatedly and alternately transmitted during the calibration period.

In various examples, the calibration period occurs when the 3-wire interface 2212 is initialized or between transmissions of frames on the 3-wire interface 2212.

In one example, the apparatus 2200 may include modules and/or circuits 2210, 2212 that are adapted to monitor the 3-wire interface 2212 while transmitting a version of the 3-phase signal on each wire of the 3-wire interface 2212, and calibrate one or more timing circuit based on characteristics of the 3-wire interface 2212 that are determined by monitoring the 3-wire interface 2212.

Figure 23:
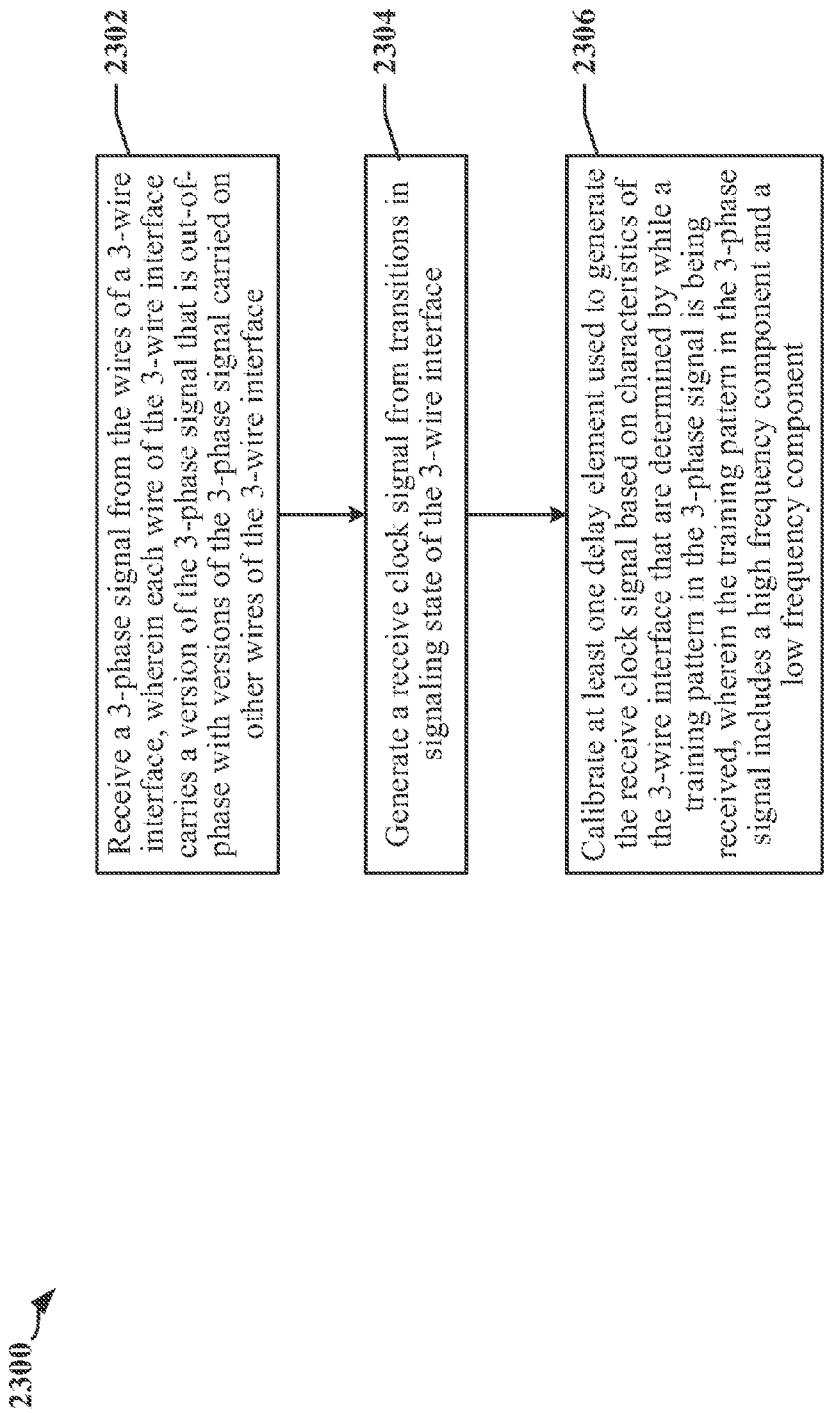
FIG. 23 is a flowchart of a second method of clock generation according to certain aspects disclosed herein.

FIG. 23 is a flowchart 2300 of a method of calibration that may be performed by a receiver circuit in an apparatus coupled to a C-PHY 3-Phase interface.

At block 2302, the receiver circuit may receive a 3-phase signal from the wires of a 3-wire interface. Each wire of the 3-wire interface carries a version of the 3-phase signal that is out-of-phase with the versions of the 3-phase signal carried on the other wires of the 3-wire interface.

At block 2304, the receiver circuit may generate a receive clock signal from transitions in signaling state of the 3-wire interface.

At block 2306, the receiver circuit may calibrate calibrating at least one delay element used to generate the receive clock signal based on characteristics of the 3-wire interface that are determined while a training pattern in the 3-phase signal is being received. The training pattern in the 3-phase signal may include a high frequency component and a low frequency component.

In some examples, receiving the 3-phase signal includes decoding a set of symbols from the 3-phase signal. A first sequence of symbols in the set of symbols is configured to produce a constant output at a differential receiver of the receiving device during a first portion of a calibration period. The differential receiver is coupled to two wires of the 3-wire interface. A second sequence of symbols in the set of symbols is configured to cause the differential receiver to produce an output that changes for every symbol transmitted during a second portion of the calibration period. The set of symbols may be configured to produce a two-part training pattern in a signal provided by the differential receiver. A first part of the two-part training pattern and a second part of the two-part training pattern are the inverses of one another. In one example, the set of symbols includes 32 symbols when decoded correctly. In another example, the set of symbols is repeatedly received during the calibration period.

In various examples, the receiver circuit may determine whether the set of symbols corresponds to a set of training symbols known to the receiving device and, when the set of symbols is different from the set of training symbols, the receiver circuit may adjust the at least one delay element until the set of symbols corresponds to a set of training symbols. The training pattern may be received while the 3-wire interface is being initialized. The training pattern may be received between transmissions of frames on the 3-wire interface.

In some examples, an operating characteristic of the C-PHY interface may be determined while the training pattern is being received. The at least one delay element may be calibrated based on the operating characteristic of the C-PHY interface. The operating characteristic of the C-PHY interface may include a minimum unit interval time. The operating characteristic of the C-PHY interface may include a measurement of maximum encoding jitter. The operating characteristic of the C-PHY interface may include a measurement of worst case inter-symbol interference.

Figure 24:
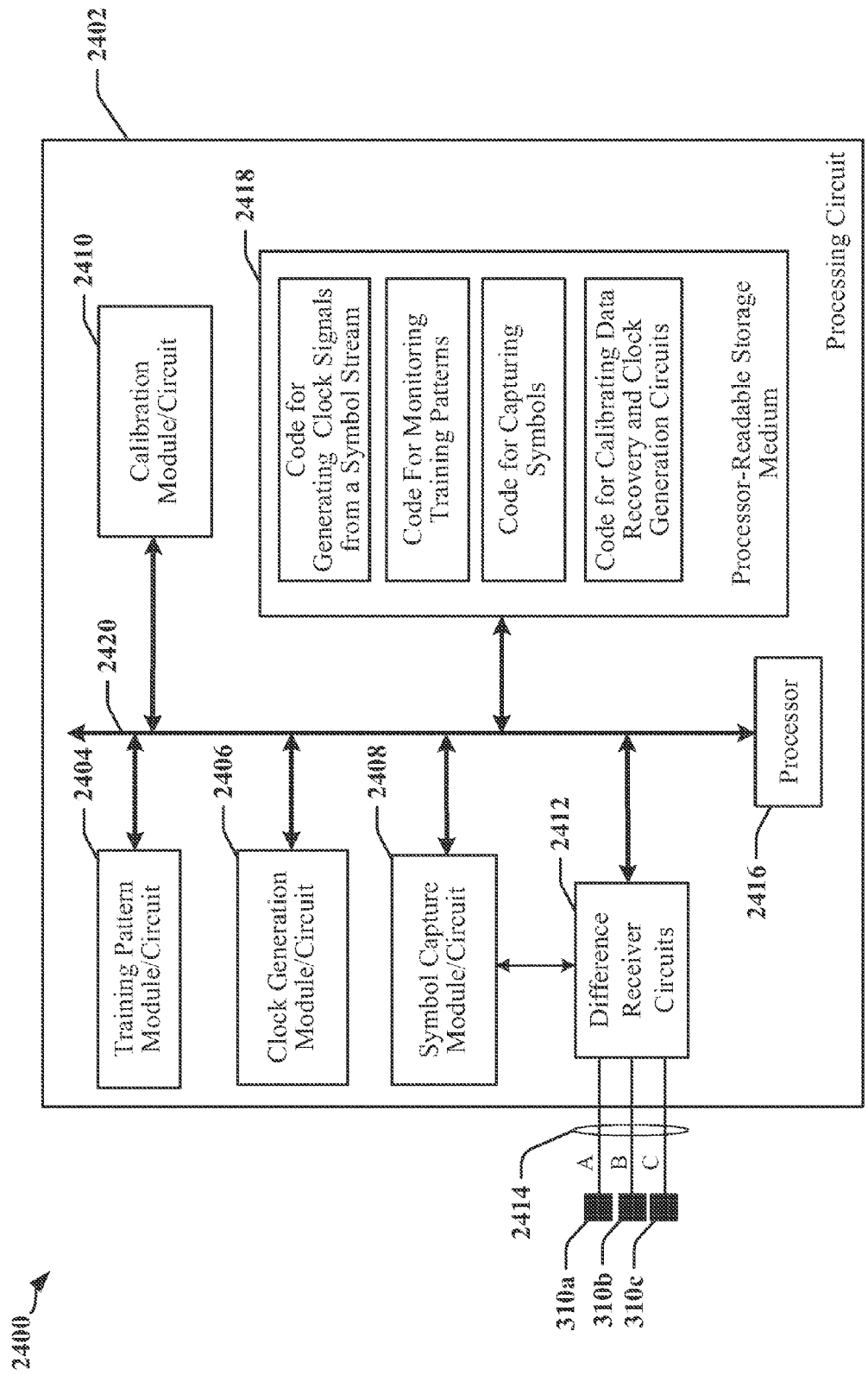
FIG. 24 is a diagram illustrating a second example of a hardware implementation for an apparatus employing a processing employing a processing circuit adapted according to certain aspects disclosed herein.

FIG. 24 is a diagram illustrating an example of a hardware implementation for an apparatus 2400 employing a processing circuit 2402. The processing circuit typically has a processor 2416 that may include one or more of a microprocessor, microcontroller, digital signal processor, a sequencer and a state machine. The processing circuit 2402 may be implemented with a bus architecture, represented generally by the bus 2420. The bus 2420 may include any number of interconnecting buses and bridges depending on the specific application of the processing circuit 2402 and the overall design constraints. The bus 2420 links together various circuits including one or more processors and/or hardware modules, represented by the processor 2416, the modules or circuits 2404, 2406, 2408 and 2410, difference receiver circuits 2412 that determine difference signaling state between different pairs of the connectors or wires 310a, 310b, 310c and the computer-readable storage medium 2418. The bus 2420 may also link various other circuits such as timing sources, peripherals, voltage regulators, and power management circuits, which are well known in the art, and therefore, will not be described any further.

The processor 2416 is responsible for general processing, including the execution of software stored on the computer-readable storage medium 2418. The software, when executed by the processor 2416, causes the processing circuit 2402 to perform the various functions described supra for any particular apparatus. The computer-readable storage medium 2418 may also be used for storing data that is manipulated by the processor 2416 when executing software, including data decoded from symbols transmitted over the connectors or wires 310a, 310b, 310c, which may be configured as data lanes and clock lanes. The processing circuit 2402 further includes at least one of the modules 2404, 2406, 2408 and 2410. The modules 2404, 2406, 2408 and 2410 may be software modules running in the processor 2416, resident/stored in the computer-readable storage medium 2418, one or more hardware modules coupled to the processor 2416, or some combination thereof. The modules 2404, 2406, 2408 and/or 2410 may include microcontroller instructions, state machine configuration parameters, or some combination thereof.

In one configuration, the apparatus 2400 may be configured for data communication over a C-PHY 3-phase interface. The apparatus 2400 may include modules and/or circuits 2408, 2412 that are configured to receive a 3-phase signal from the wires 310a, 310b, 310c of a 3-wire interface 2414. Each wire 310a, 310b or 310c of the 3-wire interface 2414 carries a version of the 3-phase signal that is out-of-phase with versions of the 3-phase signal carried on other wires 310a, 310b and/or 310c of the 3-wire interface 2414. The apparatus 2400 may include a module and/or circuit 2406 that is configured to generate a receive clock signal from transitions in signaling state of the 3-wire interface 2414, and a module and/or circuit 2410 that is configured to calibrate at least one delay element used to generate the receive clock signal based on characteristics of the 3-wire interface 2414 that are determined while a training pattern in the 3-phase signal is being received. The training pattern in the 3-phase signal may include a high frequency component and a low frequency component.

In some examples, the modules and/or circuits 2408, 2412 may be configured to decode a set of symbols from the 3-phase signal. A first sequence of symbols in the set of symbols may be configured to produce a constant output at a differential receiver of the receiving device during a first portion of a calibration period. The differential receiver may be coupled to two wires 310*a*, 310*b* and/or 310*c* of the 3-wire interface 2414. A second sequence of symbols in the set of symbols may be configured to cause the differential receiver to produce an output that changes for every symbol transmitted during a second portion of the calibration period. The set of symbols may be configured to produce a two-part training pattern in a signal provided by the differential receiver. The first part of the two-part training pattern and the second part of the two-part training pattern may be inverses of one another. In one example, the set of symbols includes 32 symbols when decoded correctly. The set of symbols may be repeatedly received during the calibration period.

In various examples, the module and/or circuit 2410 may be configured to determine whether the set of symbols corresponds to a set of training symbols known to the receiving device, and adjust the at least one delay element when the set of symbols is different from the set of training symbols. This adjustment may be performed until the set of symbols corresponds to a set of training symbols.

In some examples, the training pattern is received while the 3-wire interface 2414 is being initialized. The training pattern may be received between transmissions of frames on the 3-wire interface.

In some examples, the module and/or circuit 2410 may be configured to determine an operating characteristic of the 3-wire interface 2414 while the training pattern is being received, and calibrate calibrating the at least one delay element based on the operating characteristic of the 3-wire interface 2414. The operating characteristic of the 3-wire interface 2414 may include a minimum unit interval time. The operating characteristic of the 3-wire interface 2414 may include a measurement of maximum encoding jitter. The operating characteristic of the 3-wire interface 2414 may include a measurement of worst case inter-symbol interference.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of calibration at a transmitting device, comprising:
    configuring a signal to include a training pattern with a high frequency component and a low frequency component during a calibration period; and
    transmitting a version of the signal on each wire of a 3-wire interface, wherein the version of the signal transmitted on each wire is out-of-phase with versions of the signal transmitted on each other wire of the 3-wire interface, and
    wherein the signal is configured to enable a receiver to determine certain operating parameters of the 3-wire interface.

2. The method of claim 1, wherein configuring the signal comprises:
    transmitting a first sequence of symbols selected to cause a differential receiver to produce a constant output during a first portion of the calibration period, and wherein the differential receiver is coupled to two wires of the 3-wire interface.

3. The method of claim 2, wherein configuring the signal comprises:
    transmitting a second sequence of symbols selected to cause the differential receiver to produce an output that changes for every symbol transmitted during a second portion of the calibration period.

4. The method of claim 1, wherein configuring the signal comprises:
    transmitting two sequences of symbols that cause a differential receiver to produce output signals that are inverse of one another, and wherein each of the two sequences of symbols alternates in transmission during the calibration period.

5. The method of claim 4, wherein each of the two sequences of symbols includes 16 symbols.

6. The method of claim 4, wherein the two sequences of symbols are repeatedly and alternately transmitted during the calibration period.

7. The method of claim 1, wherein the calibration period occurs when the 3-wire interface is initialized.

8. The method of claim 1, wherein the calibration period occurs between transmissions of frames on the 3-wire interface.

9. The method of claim 1, further comprising:
    monitoring the 3-wire interface while transmitting a version of the signal on each wire of the 3-wire interface; and
    calibrating one or more timing circuit based on characteristics of the 3-wire interface that are determined by monitoring the 3-wire interface.

10. An apparatus comprising:
    means for configuring a signal to include a training pattern with a high frequency component and a low frequency component during a calibration period; and
    means for transmitting a version of the signal on each wire of a 3-wire interface, wherein the version of the signal transmitted on each wire is out-of-phase with versions of the signal transmitted on each other wire of the 3-wire interface, and
    wherein the signal is configured to enable a receiver to determine certain operating parameters of the 3-wire interface.

11. The apparatus of claim 10, wherein the means for configuring the signal is adapted to:
    transmit a first sequence of symbols selected to cause a differential receiver to produce a constant output during a first portion of the calibration period, and wherein the differential receiver is coupled to two wires of the 3-wire interface; and transmit a second sequence of symbols selected to cause the differential receiver to produce an output that changes for every symbol transmitted during a second portion of the calibration period.

12. The apparatus of claim 10, wherein the means for configuring the signal is adapted to:

transmit two sequences of symbols that cause a differential receiver to produce output signals that are inverse of one another, wherein each of the two sequences of symbols alternates in transmission during the calibration period, wherein each of the two sequences of symbols includes 16 symbols, and wherein the two sequences of symbols are repeatedly and alternately transmitted during the calibration period.

13. The apparatus of claim 10, further comprising:

means for monitoring the 3-wire interface while transmitting a version of the signal on each wire of the 3-wire interface; and means for calibrating one or more timing circuit based on characteristics of the 3-wire interface that are determined by monitoring the 3-wire interface.

14. A method of calibration at a receiving device, comprising:

receiving a signal from a 3-wire interface, wherein each wire of the 3-wire interface carries a version of the signal that is out-of-phase with versions of the signal carried on other wires of the 3-wire interface;

generating a receive clock signal from transitions in signaling state of the 3-wire interface; and calibrating at least one delay element used to generate the receive clock signal based on characteristics of the 3-wire interface that are determined while a training pattern in the signal is being received, wherein the training pattern in the signal includes a high frequency component and a low frequency component.

15. The method of claim 14, wherein receiving the signal comprises:

decoding a set of symbols from the signal, wherein a first sequence of symbols in the set of symbols is configured to produce a constant output at a differential receiver of the receiving device during a first portion of a calibration period, and wherein the differential receiver is coupled to two wires of the 3-wire interface.

16. The method of claim 15, wherein a second sequence of symbols in the set of symbols is configured to cause the differential receiver to produce an output that changes for every symbol transmitted during a second portion of the calibration period.

17. The method of claim 15, wherein the set of symbols is configured to produce a two-part training pattern in a signal provided by the differential receiver, and wherein a first part of the two-part training pattern and a second part of the two-part training pattern are inverses of one another.

18. The method of claim 15, wherein the set of symbols includes 32 symbols when decoded correctly.

19. The method of claim 15, wherein the set of symbols is repeatedly received during the calibration period.

20. The method of claim 15, further comprising:

determining whether the set of symbols corresponds to a set of training symbols known to the receiving device; and when the set of symbols is different from the set of training symbols, adjusting the at least one delay element until the set of symbols corresponds to the set of training symbols.

21. The method of claim 14, wherein the training pattern is received while the 3-wire interface is being initialized.

22. The method of claim 14, wherein the training pattern is received between transmissions of frames on the 3-wire interface.

23. The method of claim 14, further comprising:

determining an operating characteristic of the 3-wire interface while the training pattern is being received; and calibrating the at least one delay element based on the operating characteristic of the 3-wire interface.

24. The method of claim 23, wherein the operating characteristic of the 3-wire interface comprises a minimum unit interval time.

25. The method of claim 23, wherein the operating characteristic of the 3-wire interface comprises a measurement of maximum encoding jitter.

26. The method of claim 23, wherein the operating characteristic of the 3-wire interface comprises a measurement of worst case inter-symbol interference.

27. An apparatus comprising:

means for receiving a signal from a 3-wire interface, wherein each wire of the 3-wire interface carries a version of the signal that is out-of-phase with versions of the signal carried on other wires of the 3-wire interface;

means for generating clock signals, configured to generate a receive clock signal from transitions in signaling state of the 3-wire interface, wherein the means for generating clock signals comprises at least one delay element; and means for calibrating the least one delay element, wherein the means for calibrating is configured to operate based on characteristics of the 3-wire interface that are determined while a training pattern in the signal is being received, and wherein the training pattern in the signal includes a high frequency component and a low frequency component.

28. The apparatus of claim 27, wherein the means for receiving the signal is configured to:

decode a set of symbols from the signal, wherein a first sequence of symbols in the set of symbols is configured to produce a constant output at a differential receiver during a first portion of a calibration period, the differential receiver being coupled to two wires of the 3-wire interface, wherein a second sequence of symbols in the set of symbols is configured to cause the differential receiver to produce an output that changes for every symbol transmitted during a second portion of the calibration period, wherein the set of symbols is configured to produce a two-part training pattern in a signal provided by the differential receiver, and wherein a first part of the two-part training pattern and a second part of the two-part training pattern are inverses of one another.

29. The apparatus of claim 28, further comprising:

means for determining whether the set of symbols corresponds to a set of training symbols known to the apparatus; and means for adjusting delay elements configured to adjust the at least one delay element until the set of symbols corresponds to the set of training symbols, wherein the training pattern is received while the 3-wire interface is being initialized or between transmissions of frames on the 3-wire interface.

30. The apparatus of claim 27, wherein the means for calibrating the least one delay element is configured to:
determine an operating characteristic of the 3-wire interface while the training pattern is being received; and
calibrate the at least one delay element based on the operating characteristic of the 3-wire interface,
wherein the operating characteristic of the 3-wire interface comprises a minimum unit interval time, a measurement of maximum encoding jitter, or a measurement of worst case inter-symbol interference.

* * * * *